United States Patent
Desai et al.

(10) Patent No.: US 12,298,903 B2
(45) Date of Patent: May 13, 2025

(54) EFFECTIVE DRAM INTERLEAVING FOR ASYMMETRIC SIZE CHANNELS OR RANKS WHILE SUPPORTING IMPROVED PARTIAL ARRAY SELF-REFRESH

(71) Applicant: QUALCOMM Incorporated, San Diego, CA (US)

(72) Inventors: Kunal Desai, Bangalore (IN); Saurabh Jaiswal, Kaushambi (IN); Vikrant Kumar, Bangalore (IN); Swaraj Sha, Bangalore (IN); Dharmesh Parikh, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 73 days.

(21) Appl. No.: 18/314,167

(22) Filed: May 9, 2023

(65) Prior Publication Data

US 2023/0274774 A1    Aug. 31, 2023

Related U.S. Application Data

(62) Division of application No. 17/174,073, filed on Feb. 11, 2021, now Pat. No. 11,749,332.

(51) Int. Cl.
  *G06F 12/06*  (2006.01)
  *G11C 11/406*  (2006.01)

(52) U.S. Cl.
  CPC .... *G06F 12/0607* (2013.01); *G11C 11/40618* (2013.01); *G06F 12/06* (2013.01)

(58) Field of Classification Search
  CPC ........... G11C 11/40618; G06F 12/0607; G06F 12/06; G06F 12/0223; G06F 2212/1016; G06F 2212/7208
  See application file for complete search history.

(56) References Cited

U.S. PATENT DOCUMENTS 9,110,795 B2   8/2015  Stewart et al.
9,727,452 B2   8/2017  Karamcheti et al.
(Continued)

FOREIGN PATENT DOCUMENTS

EP       2929447 A1      10/2015
WO    2014092884 A1       6/2014

OTHER PUBLICATIONS

Agarwal, Neha. "Paving the Path for Heterogeneous Memory Adoption in Production Systems", 2017, University of Michigan, pp. 1-116 (Year: 2017).*

(Continued)

*Primary Examiner* — Curtis James Kortman
(74) *Attorney, Agent, or Firm* — Muncy, Geissler, Olds & Lowe, P.C./QUALCOMM

(57) ABSTRACT

Various embodiments include methods and devices for portion interleaving for asymmetric size memory portions. Embodiments may include determining an asymmetric memory portion assignment for an interleave unit, determining a consumed address space offset for consumed address space of a memory, modifying an address of the interleave unit using the consumed address space offset, and assigning the interleave unit to an interleave granule in the asymmetric memory portion using the modified address in a compact manner before assigning another interleave unit to another interleave granule. Embodiments may include receiving an address of memory access request in a memory, mapping the address to an interleave granule in an asymmetric memory portion, assigning consecutive interleave units to the interleave granule while the interleave granule has unused space before assigning another interleave unit to another interleave granule, and implementing the memory access request at the mapped address.

28 Claims, 12 Drawing Sheets

(56) References Cited

U.S. PATENT DOCUMENTS

| | | | |
|---|---|---|---|
| 2008/0055325 A1* | 3/2008 | Seigneret | G09G 5/39 |
| | | | 345/531 |
| 2013/0232289 A1 | 9/2013 | Zhong et al. | |
| 2014/0164690 A1* | 6/2014 | De | G06F 12/0607 |
| | | | 711/105 |
| 2015/0100746 A1* | 4/2015 | Rychlik | G06F 12/0607 |
| | | | 711/157 |
| 2017/0162235 A1 | 6/2017 | De et al. | |
| 2021/0149804 A1* | 5/2021 | Xin | G06F 12/0607 |
| 2022/0004336 A1 | 1/2022 | Naghate et al. | |
| 2022/0254409 A1 | 8/2022 | Desai et al. | |

OTHER PUBLICATIONS

International Search Report and Written Opinion—PCT/US2022/011771—ISA/EPO—May 11, 2022 16 pages.

* cited by examiner

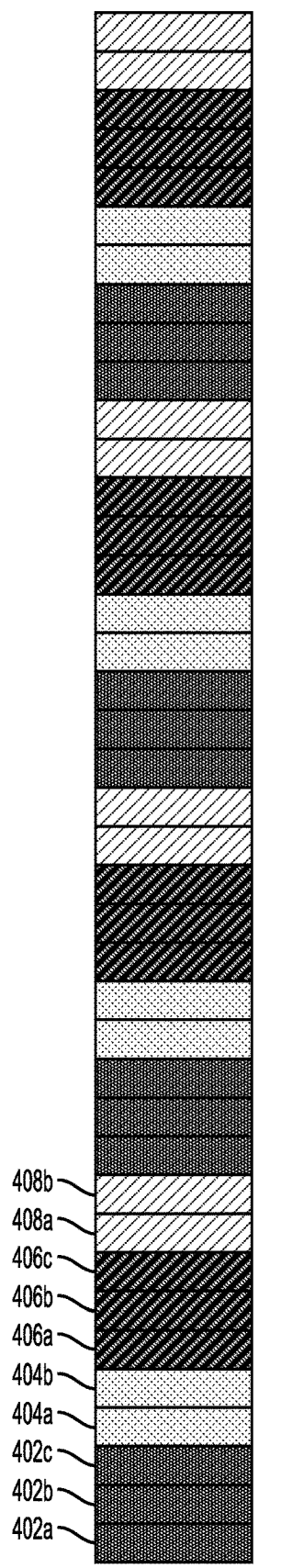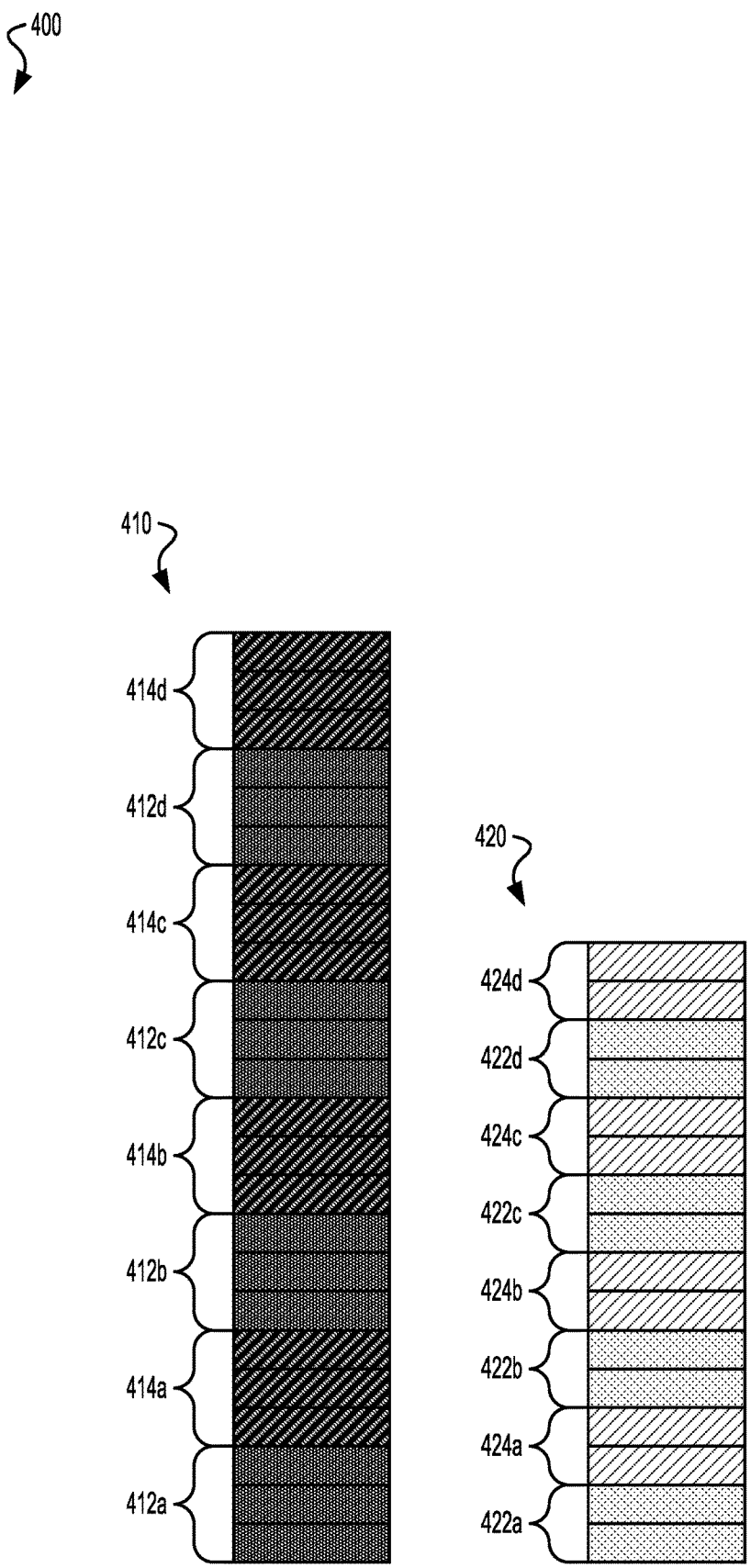
FIG. 4A                    FIG. 4B

EFFECTIVE DRAM INTERLEAVING FOR ASYMMETRIC SIZE CHANNELS OR RANKS WHILE SUPPORTING IMPROVED PARTIAL ARRAY SELF-REFRESH

RELATED APPLICATIONS

This application is a division of U.S. Non-Provisional application Ser. No. 17/174,073 entitled "Effective DRAM Interleaving For Asymmetric Size Channels Or Ranks While Supporting Improved Partial Array Self-Refresh" filed Feb. 11, 2021, the entire contents of which is hereby incorporated by reference for all purposes.

BACKGROUND

Dynamic random-access memory (DRAM) rank interleaving, or hashing, increases DRAM usage efficiency by spreading transactions directed to a single rank across multiple ranks. However, current schemes of DRAM rank interleaving do not permit systems using asymmetric size DRAM ranks to achieve the increases of DRAM usage efficiency in all DRAM ranks. Additionally, current schemes of DRAM rank interleaving allocate unused interleaving blocks to sectors in the ranks that induce costly overhead for partial array self-refresh and partial array auto-refresh.

SUMMARY

Various disclosed aspects may include apparatuses and methods for rank interleaving for asymmetric size DRAM ranks. Various aspects may include a method of portion interleaving for asymmetric size memory portions of a memory, including determining an asymmetric memory portion assignment for a first interleave unit, in which the asymmetric memory portion assignment is to a first asymmetric memory portion, determining a consumed address space offset for consumed address space of the memory, modifying an address of the first interleave unit using the consumed address space offset, and assigning the first interleave unit to a first interleave granule in the first asymmetric memory portion using the modified address in a compact manner such that the first interleave unit is assigned to the first interleave granule while the first interleave granule has unused space before mapping another interleave unit to another interleave granule.

In some aspects, determining the consumed address space offset for consumed address space of the memory may include determining the consumed address space offset for consumed address space of at least a second asymmetric memory portion.

In some aspects, modifying the address of the first interleave unit using the consumed address space offset may include subtracting the consumed address space offset from the address of the first interleave unit.

In some aspects, determining the asymmetric memory portion assignment for the first interleave unit may include determining an asymmetric memory portion capacity ratio of asymmetric size memory portions including the first asymmetric memory portion, determining a combined asymmetric memory portion capacity of the asymmetric size memory portions, determining a value of a function using the address of the first interleave unit and the combined asymmetric memory portion capacity, and comparing the value of the function to a value of the asymmetric memory portion capacity ratio of asymmetric size memory portions representing an asymmetric size memory portion of the asymmetric size memory portions.

Some aspects may further include receiving an address of a memory access request in the memory, mapping the address to the first interleave unit in the first asymmetric memory portion, and implementing the memory access request at the mapped address within the first asymmetric memory portion.

In some aspects, assigning the first interleave unit to the first interleave granule in the first asymmetric memory portion using the modified address in the compact manner may include assigning the first interleave unit to the first interleave granule in the first asymmetric memory portion linearly to a second interleave unit assigned to the first interleave granule in the first asymmetric memory portion.

In some aspects, assigning the first interleave unit to the first interleave granule in the first asymmetric memory portion using the modified address in the compact manner may include assigning the first interleave unit to the first interleave granule in the first asymmetric memory portion nonlinearly to a second interleave unit assigned to the first interleave granule in the first asymmetric memory portion.

In some aspects, assigning the first interleave unit to the first interleave granule in the first asymmetric memory portion using the modified address in the compact manner such that the first interleave unit is assigned to the first interleave granule while the first interleave granule has unused space before mapping another interleave unit to another interleave granule may include assigning the first interleave unit to the first interleave granule in the first asymmetric memory portion such that the first interleave unit is assigned to the first interleave granule while the first interleave granule has unused space before mapping another interleave unit to another interleave granule in another asymmetric memory portion.

Some aspects may further include enabling refresh of a first refresh segment having the assigned first interleave unit, and disabling refresh of a second refresh segment not having an assigned interleave unit.

In some aspects, the first interleave granule may be a same size as a refresh segment for a dynamic random-access memory refresh control policy.

Various aspects may include a method of portion interleaving for asymmetric size memory portions of a memory, including receiving an address of a memory access request in the memory, mapping the address to a first interleave granule in a first asymmetric memory portion, assigning consecutive interleave units to the first interleave granule while the first interleave granule has unused space before assigning another interleave unit to another interleave granule, in which at least a first interleave unit of the consecutive interleave units corresponds to the address, and implementing the memory access request at the mapped address within the first asymmetric memory portion.

In some aspects, mapping the address to the first interleave granule in the first asymmetric memory portion may include determining a consumed address space offset for consumed address space of the memory in a second asymmetric memory portion, and modifying the address using the consumed address space offset.

In some aspects, modifying the address using the consumed address space offset may include subtracting the consumed address space offset from the address.

In some aspects, mapping the address to the first interleave granule may include determining an asymmetric memory portion assignment of the address.

In some aspects, determining the asymmetric memory portion assignment of the address may include determining an asymmetric memory portion capacity ratio of asymmetric size memory portions including the first asymmetric memory portion, determining a combined asymmetric memory portion capacity of the asymmetric size memory portions, determining a value of a function using the address and the combined asymmetric memory portion capacity, and comparing the value of the function to a value of the asymmetric memory portion capacity ratio of asymmetric size memory portions representing an asymmetric size memory portion of the asymmetric size memory portions.

In some aspects, assigning consecutive interleave units to the first interleave granule may include assigning a first consecutive interleave unit of the consecutive interleave units linearly to a second interleave unit of the consecutive interleave units.

In some aspects, assigning consecutive interleave units to the first interleave granule may include assigning a first consecutive interleave unit of the consecutive interleave units nonlinearly to a second interleave unit of the consecutive interleave units.

In some aspects, assigning consecutive interleave units to the first interleave granule may include assigning the consecutive interleave units to a refresh segment for a dynamic random-access memory refresh control policy while the first refresh segment has unused space before assigning another interleave unit to another refresh segment.

Further aspects include a computing device having a processing device configured to perform operations of any of the methods summarized above. Further aspects include a computing device having means for performing functions of any of the methods summarized above. Further aspects include a non-transitory processor-readable medium having stored thereon processor-executable instructions configured to cause a processor and other components of a computing device to perform operations of any of the methods summarized above.

BRIEF DESCRIPTION OF THE DRAWINGS

The accompanying drawings, which are incorporated herein and constitute part of this specification, illustrate example embodiments of various embodiments, and together with the general description given above and the detailed description given below, serve to explain the features of the claims.

FIGS. 4A-4D are block diagrams illustrating examples of DRAM portion interleaving for asymmetric size DRAM portions suitable for implementing various embodiments.

DETAILED DESCRIPTION

Figure 1:
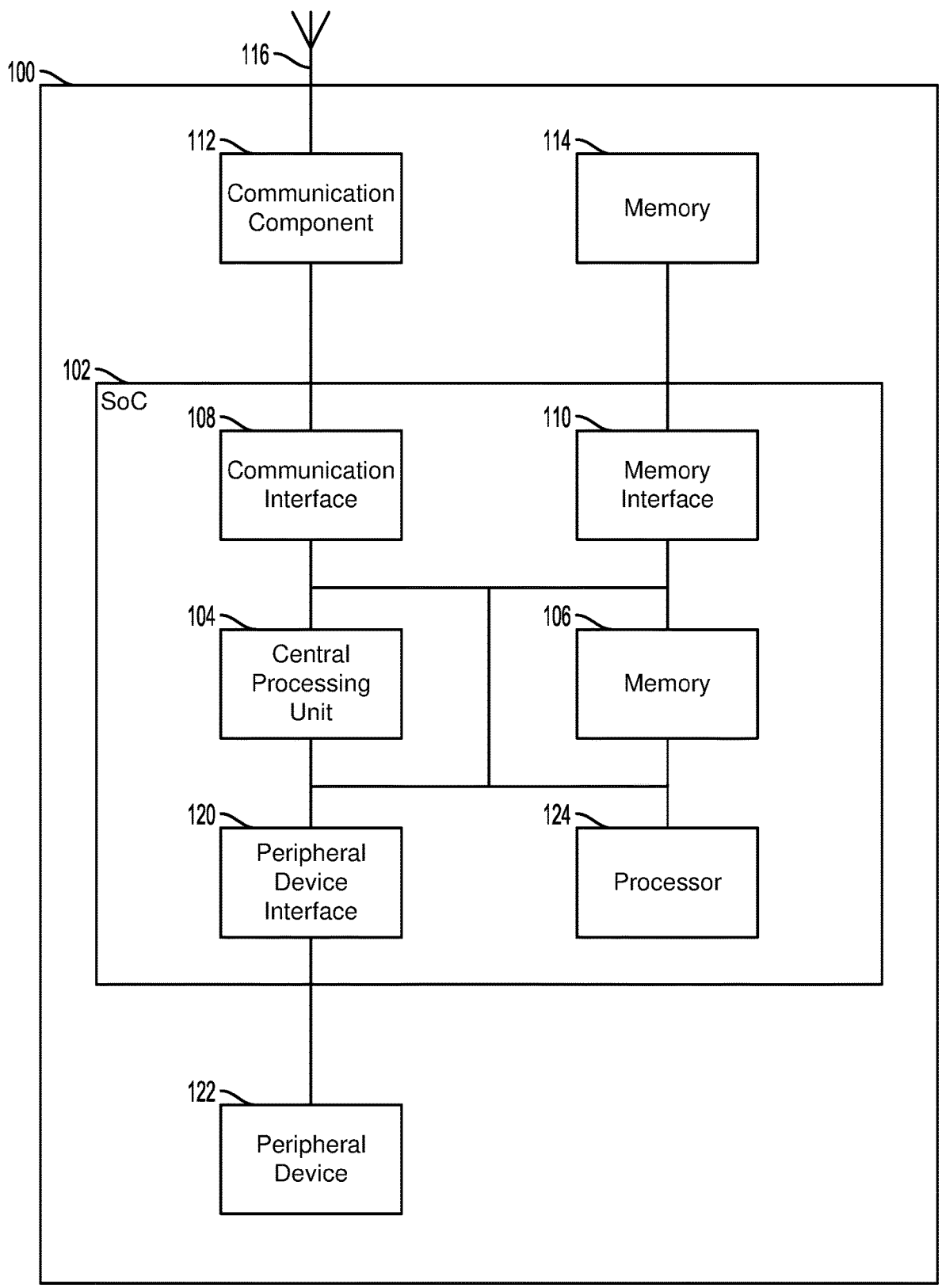
FIG. 1 is a component block diagram illustrating an example computing device suitable for implementing various embodiments.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the claims.

Various embodiments include methods, and computing devices implementing such methods of dynamic random-access memory (DRAM) portion interleaving for asymmetric size DRAM portions. Embodiments may include assigning consecutive interleave units to each asymmetric DRAM portion, such as a DRAM channel and/or a DRAM rank, in sequential order. Some embodiments may include mapping addresses to asymmetric DRAM portions in a manner in which consecutive interleave units are assigned to a same refresh segment. Some embodiments may include mapping addresses to asymmetric DRAM portions in a compact manner within the refresh segment within the asymmetric DRAM portion.

The terms "computing device" and "mobile computing device" are used interchangeably herein to refer to any one or all of cellular telephones, smartphones, personal or mobile multi-media players, personal data assistants (PDA's), laptop computers, tablet computers, convertible laptops/tablets (2-in-1 computers), smartbooks, ultrabooks, netbooks, palm-top computers, wireless electronic mail receivers, multimedia Internet enabled cellular telephones, mobile gaming consoles, wireless gaming controllers, and similar personal electronic devices that include a memory, and a programmable processor. The term "computing device" may further refer to stationary computing devices including personal computers, desktop computers, all-in-one computers, workstations, super computers, mainframe computers, embedded computers (such as in vehicles and other larger systems), servers, multimedia computers, and game consoles.

The term "DRAM portion" is used herein to refer to any one or all of a DRAM channel and a DRAM rank. Examples described herein using the terms "DRAM portion", "DRAM channel", and "DRAM rank" may be similarly applied to any of these terms.

Rank interleaving spreads a DRAM address space over multiple ranks of the DRAM by changing ranks based on a designated granularity, such as a certain amount of memory. Similarly, rank hashing may change ranks of the DRAM based on a function of a designated portion of address bits, and the function may be configured in a manner that corresponds to a certain amount of memory. Each DRAM rank may be a different die of the DRAM. An interleave unit may be a portion of the DRAM address space assigned to a DRAM rank, such as a certain amount of memory and/or a certain range of addresses. Various embodiments are described in terms of DRAM portion interleaving for clarity and ease of explanation; however, the descriptions are not intended to limit the scope of the claims, which may similarly apply to DRAM portion DRAM portion hashing.

Rank interleaving is often implemented for equivalently sized DRAM ranks. The rank interleaving allocates interleave units of the equivalently sized DRAM ranks in the DRAM in an equally alternating manner, such that an interleave unit from each DRAM rank is allocated before another interleave unit from each of the DRAM ranks are allocated. DRAM usage efficiency is improved by using rank interleaving by spreading transactions directed to the DRAM across multiple DRAM ranks. As such, some parts of transactions to the DRAM can be implemented concurrently using different DRAM ranks, rather than sequentially using a single DRAM rank.

Rank interleaving is further implemented for asymmetrically sized DRAM ranks. The rank interleaving allocates some interleave units of the asymmetrically sized DRAM ranks in the DRAM in an equally alternating manner and allocates some interleave units in a linear manner. For example, interleave units for a smaller of the asymmetric DRAM ranks and an equivalent number of interleave units of a larger of the asymmetric DRAM ranks are allocated in an equally alternating manner, and the remaining memory space of the larger of the asymmetric DRAM ranks is allocated in a linear manner. The portions of the DRAM allocated in an equally alternating manner using alternating DRAM ranks can achieve the DRAM usage efficiency improvements by applying the same principles as the rank interleaving for equivalently sized DRAM ranks. However, the portions of the DRAM allocated in a linear manner using a single DRAM rank will not achieve the DRAM usage efficiency improvements because the transactions directed to the DRAM within the linear portion of the DRAM rank are executed sequentially.

A rank or channel interleaved DRAM can also be implemented with a DRAM refresh control policy, such as partial array self-refresh (PASR) and/or partial array auto-refresh (PAAR). PASR and/or PAAR are implemented in DRAM to disable refresh of unused portions of the DRAM. PASR and/or PAAR are implemented in DRAM to ensure that only useful data stored in the DRAM is refreshed to reduce power spent in the refresh operation. The granularity of the PASR and/or PAAR schemes are based on portions of the DRAM, referred to herein as refresh segments, which can be larger than the interleave units. Rank or channel interleaving spreads interleave units across refresh segments, allocating interleave units to multiple refresh segments before a refresh segment is filled. Thus, rank or channel interleaving can leave portions of multiple refresh segments in the DRAM ranks unallocated. Refresh can be executed for a refresh segment regardless of whether all of the memory space of the refresh segment is allocated with interleave units. Refresh requires energy to be implemented, and implementing refresh for refresh segments that are not fully allocated with interleave units, i.e., having unallocated memory space, is a waste of energy. As such, rank or channel interleaving limits the effectiveness of PASR and/or PAAR by spreading the interleave units across multiple partially filled refresh segments.

Various embodiments described herein may implement DRAM portion interleaving for asymmetrically sized DRAM portions by allocating interleave units in a manner that allows all of the portions of the DRAM to achieve the DRAM usage efficiency improvements and to potentially reduce refresh power consumption. In some embodiments, the interleave units may be allocated for the asymmetrically sized DRAM portions such that allocation of interleave units to each of at least two asymmetrically sized DRAM portions are unequal, or asymmetrical, in the number of interleave units allocated to the asymmetrically sized DRAM portions. In some embodiments, the number of interleave units assigned to different asymmetrically sized DRAM portions may be based on the size of the DRAM portions. The asymmetric interleaving of interleave units throughout the DRAM portions may spread transactions directed to the DRAM across the multiple DRAM portions and avoid transactions directed to the DRAM being executed sequentially within a linear portion of a DRAM portion.

Further, in some embodiments, each allocation of interleave units to a DRAM portion may be allocated within a same refresh segment until a refresh segment is filled, or fully allocated with interleave units. In some embodiments, interleave units may be allocated to consecutive refresh segments in the DRAM portion. Allocating the interleave units to consecutive refresh segments in the DRAM portions may compact the memory space allocated for the interleave units in each DRAM portion compared to existing rank or channel interleaving. Interleave units may be allocated to a particular refresh segment by mapping addresses in the DRAM to addresses of the refresh segment in the DRAM portions. A refresh segment may be a smallest unit capacity that may be refreshed. For example, a refresh segment may be a DRAM capacity divided by 6 or 8. The consecutively allocated memory space in the DRAM portions may increase the efficiency of PASR and/or PAAR by increasing the usage of the refresh segments and reducing the overall memory space needing refreshing, allowing PASR and/or PAAR to be disabled for larger unused portions of the DRAM. The usage of a refresh segment may be increased by reducing the amount of unallocated memory space in the refresh segment by allocating more interleave units in the memory space of the refresh segment before allocating interleave units to other refresh segments. The more compact usage of memory space in the DRAM may reduce the spread of the interleave units across the DRAM reducing the overall memory space needing refreshing. Disabling refresh of some refresh segments may save energy proportional to a total capacity of switched off refresh segments divided by a total DRAM capacity.

The terms "memory" and "DRAM" are used interchangeably to describe various embodiments, unless otherwise stated. Various embodiments are described in terms of DRAM for clarity and ease of explanation, but do not limit the scope of the claims and specification. The various embodiments described herein may be similarly implemented for any memory configured with multiple asymmetric portions, such as ranks and/or channels.

FIG. 1 illustrates a system including a computing device 100 suitable for use with various embodiments. The computing device 100 may include an SoC 102 with a central processing unit 104, a memory 106, a communication interface 108, a memory interface 110, a peripheral device interface 120, and a processing device 124. The computing device 100 may further include a communication component 112, such as a wired or wireless modem, a memory 114, an antenna 116 for establishing a wireless communication link, and/or a peripheral device 122. The processor 124 may include any of a variety of processing devices, for example a number of processor cores.

The term "system-on-chip" or "SoC" is used herein to refer to a set of interconnected electronic circuits typically, but not exclusively, including a processing device, a memory, and a communication interface. A processing device may include a variety of different types of processors 124 and/or processor cores, such as a general purpose processor, a central processing unit (CPU) 104, a digital signal processor (DSP), a graphics processing unit (GPU), an accelerated processing unit (APU), a secure processing unit (SPU), an intellectual property unit (IPU), a subsystem processor of specific components of the computing device, such as an image processor for a camera subsystem or a display processor for a display, an auxiliary processor, a peripheral device processor, a single-core processor, a multicore processor, a controller, and/or a microcontroller. A processing device may further embody other hardware and hardware combinations, such as a field programmable gate array (FPGA), an application-specific integrated circuit (ASIC), other programmable logic device, discrete gate logic, transistor logic, performance monitoring hardware, watchdog hardware, and/or time references. Integrated circuits may be configured such that the components of the integrated circuit reside on a single piece of semiconductor material, such as silicon.

An SoC 102 may include one or more CPUs 104 and processors 124. The computing device 100 may include more than one SoC 102, thereby increasing the number of CPUs 104, processors 124, and processor cores. The computing device 100 may also include CPUs 104 and processors 124 that are not associated with an SoC 102. Individual CPUs 104 and processors 124 may be multicore processors. The CPUs 104 and processors 124 may each be configured for specific purposes that may be the same as or different from other CPUs 104 and processors 124 of the computing device 100. One or more of the CPUs 104, processors 124, and processor cores of the same or different configurations may be grouped together. A group of CPUs 104, processors 124, or processor cores may be referred to as a multiprocessor cluster.

The memory 106 of the SoC 102 may be a volatile or non-volatile memory configured for storing data and processor-executable code for access by the CPU 104, the processor 124, or other components of SoC 102. The computing device 100 and/or SoC 102 may include one or more memories 106 configured for various purposes. One or more memories 106 may include volatile memories such as random-access memory (RAM) or main memory, or cache memory. These memories 106 may be configured to temporarily hold a limited amount of data received from a data sensor or subsystem, data and/or processor-executable code instructions that are requested from non-volatile memory, loaded to the memories 106 from non-volatile memory in anticipation of future access based on a variety of factors, and/or intermediary processing data and/or processor-executable code instructions produced by the CPU 104 and/or processor 124 and temporarily stored for future quick access without being stored in non-volatile memory. In some embodiments, any number and combination of memories 106 may include one-time programmable or read-only memory.

The memory 106 may be configured to store data and processor-executable code, at least temporarily, that is loaded to the memory 106 from another memory device, such as another memory 106 or memory 114, for access by one or more of the CPU 104, the processor 124, or other components of SoC 102. The data or processor-executable code loaded to the memory 106 may be loaded in response to execution of a function by the CPU 104, the processor 124, or other components of SoC 102. Loading the data or processor-executable code to the memory 106 in response to execution of a function may result from a memory access request to the memory 106 that is unsuccessful, or a "miss," because the requested data or processor-executable code is not located in the memory 106. In response to a miss, a memory access request to another memory 106 or memory 114 may be made to load the requested data or processor-executable code from the other memory 106 or memory 114 to the memory 106. Loading the data or processor-executable code to the memory 106 in response to execution of a function may result from a memory access request to another memory 106 or memory 114, and the data or processor-executable code may be loaded to the memory 106 for later access.

The memory interface 110 and the memory 114 may work in unison to allow the computing device 100 to store data and processor-executable code on a volatile and/or non-volatile storage medium, and retrieve data and processor-executable code from the volatile and/or non-volatile storage medium. The memory 114 may be configured much like an embodiment of the memory 106 in which the memory 114 may store the data or processor-executable code for access by one or more of the CPU 104, the processor 124, or other components of SoC 102. In some embodiments, the memory 114, being non-volatile, may retain the information after the power of the computing device 100 has been shut off. When the power is turned back on and the computing device 100 reboots, the information stored on the memory 114 may be available to the computing device 100. In some embodiments, the memory 114, being volatile, may not retain the information after the power of the computing device 100 has been shut off. The memory interface 110 may control access to the memory 114 and allow the CPU 104, the processor 124, or other components of the SoC 12 to read data from and write data to the memory 114.

Some or all of the components of the computing device 100 and/or the SoC 102 may be arranged differently and/or combined while still serving the functions of the various embodiments. The computing device 100 may not be limited to one of each of the components, and multiple instances of each component may be included in various configurations of the computing device 100.

Figure 2A:
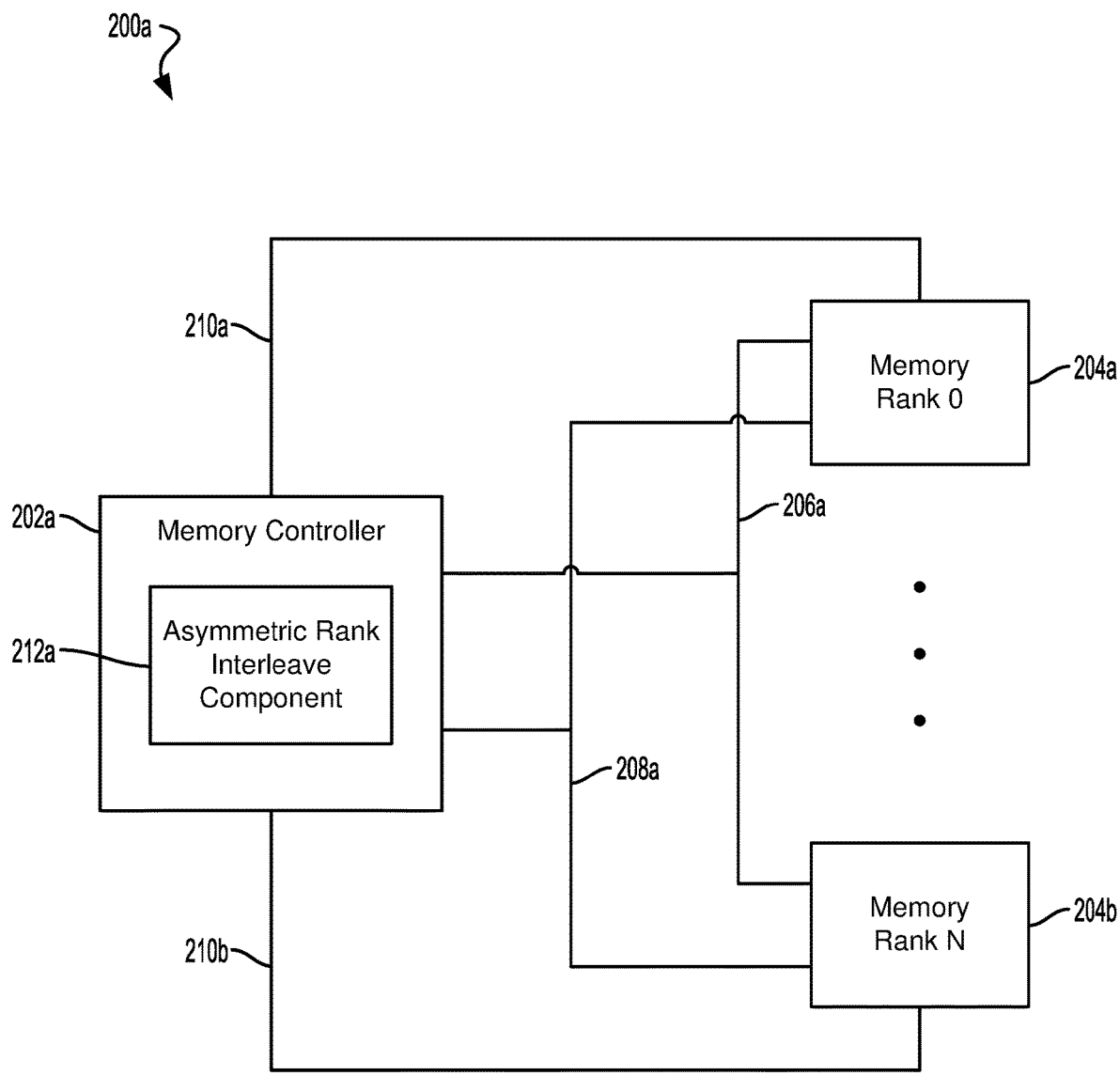
FIGS. 2A-2C are component block diagrams illustrating example dynamic random-access memory (DRAM) systems suitable for implementing various embodiments.
Figure 2B:
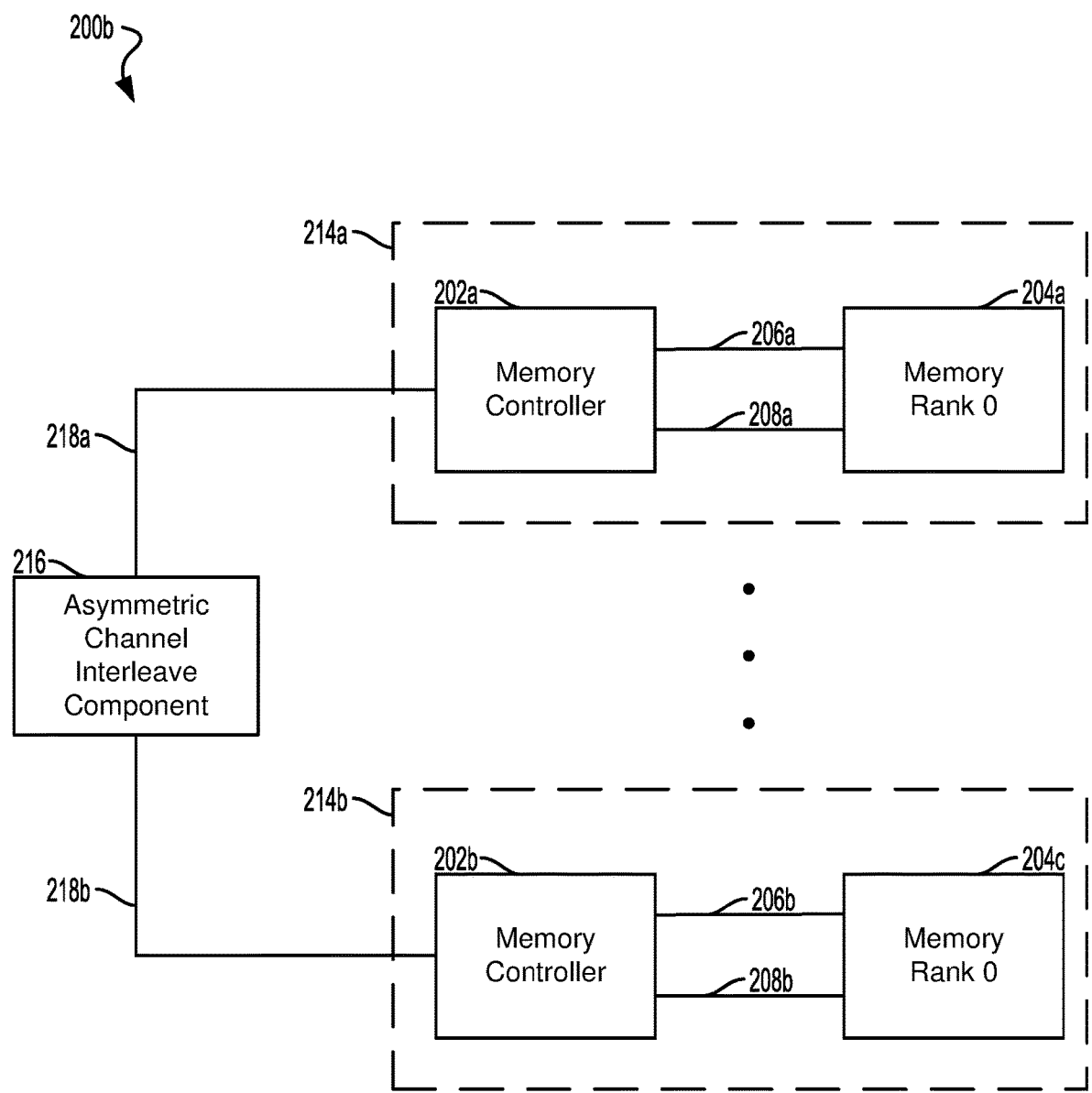
Figure 2C:
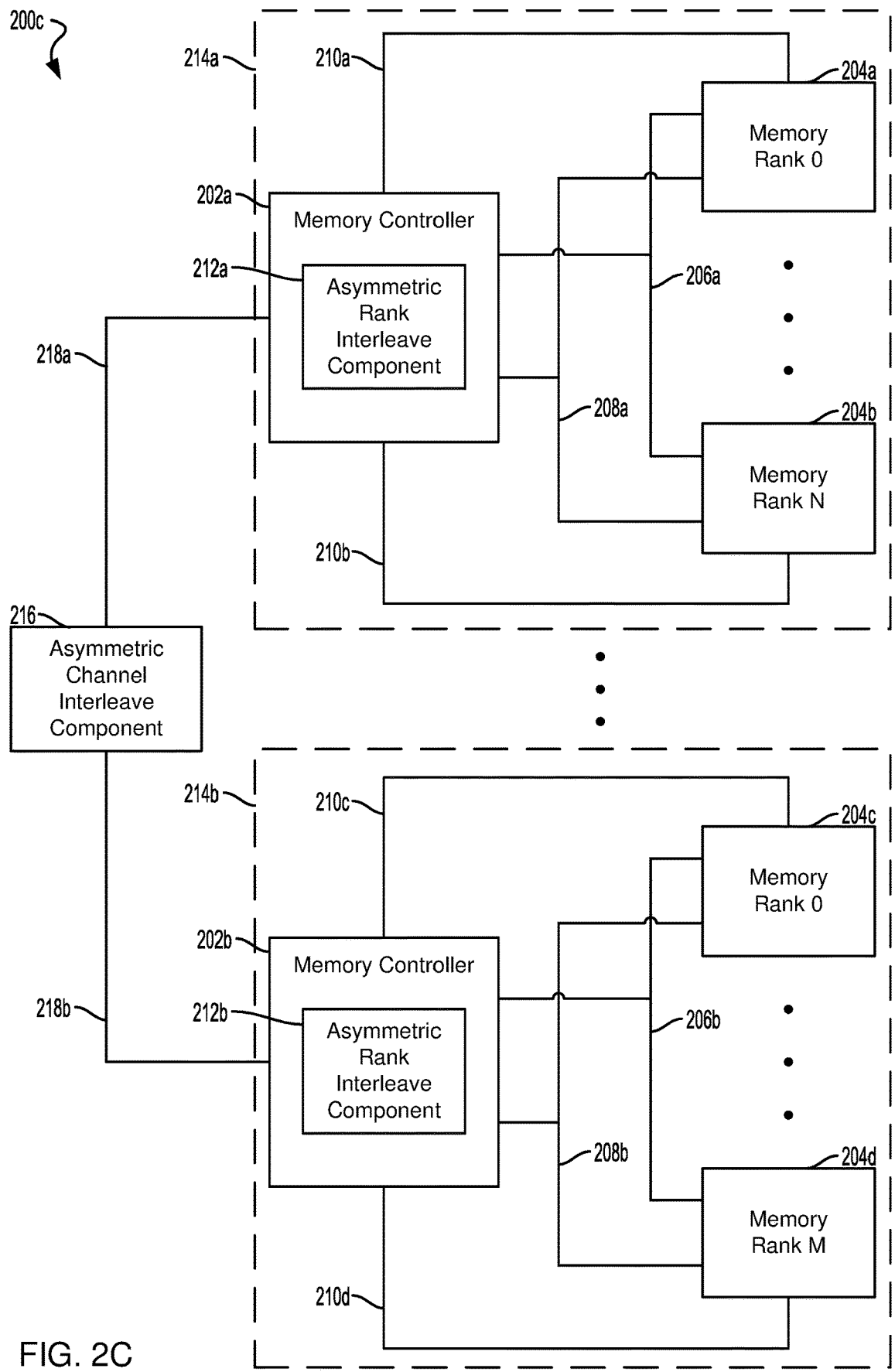

FIGS. 2A-2C illustrate components of a computing device (e.g., computing device 100 in FIG. 1) suitable for implementing some embodiments. With reference to FIGS. 1-2C the computing device may include components configured to implement a DRAM system 200a, 200b, 200c, which may include any number of memory controllers 202a, 202b, and any number of DRAM ranks 204a ("Memory Rank 0"), 204b ("Memory Rank N"), 204c ("Memory Rank 0"), 204d ("Memory Rank M"). The memory controller 202a, 202b may be implemented as a stand-alone component of the computing device and/or may be an integral component of another component of the computing device, such as an SoC (e.g., SoC 102 in FIG. 1), a CPU (e.g., CPU 104 in FIG. 1), a processor (e.g., processor 124 in FIG. 1), and/or a memory interface (e.g., memory interface 110 in FIG. 1). The DRAM ranks 204a, 204b, 204c, 204d may be implemented as stand-alone components of the computing device and/or may be integral components of another component of the computing device, such as an SoC and/or a memory (e.g., memory 106, 114). In some embodiments, each DRAM rank 204a, 204b, 204c, 204d may be an individual die of a DRAM integrated circuit.

In some embodiments, the DRAM system 200a may be a single channel system, an example of which is illustrated in FIG. 2A. In some embodiments, the DRAM system 200b, 200c may be a multiple channel system having any number of DRAM channels 214a, 214b, examples of which are illustrated in FIGS. 2B and 2C. The memory controller 202a, 202b may be configured to control memory read and write accesses to the DRAM ranks 204a, 204b, 204c, 204d by controlling the signals on communication busses, such as a command and address bus 206a, 206b, and a data bus 208a, 208b. The DRAM ranks 204a, 204b, 204c, 204d of the same DRAM channel 214a, 214b may share communication busses 206a, 206b, 208a, 208b. The memory controller 202a, 202b may be configured to control memory read and write accesses to the DRAM ranks 204a, 204b, 204c, 204d of the same DRAM channel 214a, 214b by controlling a dedicated chip select lines 210a, 210b, 210c, 210d, for each DRAM rank 204a, 204b, 204c, 204d. For example, the memory controller 202a, 202b may signal a memory write access to a specific memory address on the command and address bus 206a, 206b and the corresponding write data on the data bus 208a, 208b to the DRAM ranks 204a, 204b, 204c, 204d. The memory controller 202a, 202b may dictate which of the DRAM ranks 204a, 204b, 204c, 204d may implement the memory write access by signaling to the specific DRAM rank 204a, 204b, 204c, 204d on the dedicated chip select line 210a, 210b, 210c, 210d of the DRAM rank 204a, 204b, 204c, 204d. As another example, the memory controller 202a, 202b may signal a memory read access at a specific memory address on the command and address bus 206a, 206b to the DRAM ranks 204a, 204b, 204c, 204d. The memory controller 202a, 202b may dictate which of the DRAM ranks 204a, 204b, 204c, 204d may implement the memory read access by signaling to the specific DRAM rank 204a, 204b, 204c, 204d on the dedicated chip select line 210a, 210b, 210c, 210d of the DRAM rank 204a, 204b, 204c, 204d. The DRAM rank 204a, 204b, 204c, 204d implementing the memory read access may return read data on the data bus 208a, 208b. The memory controller 202a, 202b may manage concurrent memory accesses of the DRAM ranks 204a, 204b, 204c, 204d by controlling the signaling on the chip select lines 210a, 210b, 210c, 210d. For example, pages on the DRAM rank 204a may be opened using the command and address bus 206a while data access may be on-going to the DRAM rank 204b using the data bus 208a.

In some embodiments, an example of which is illustrated in FIG. 2A, the memory controller 202a may include an asymmetric rank interleave component 212a, also referred to herein as an asymmetric DRAM portion interleave component. The asymmetric rank interleave component 212a may be implemented in any combination of software, firmware, and/or hardware. The asymmetric rank interleave component 212a may cause the memory controller 202a to implement DRAM portion interleaving for asymmetrically sized DRAM ranks 204a, 204b by allocating interleave units in a manner that allows all of the portions of the DRAM to achieve DRAM usage efficiency improvements and that increases efficiency of PASR and/or PAAR by lowering refresh power, as described further herein.

In some embodiments, the DRAM system 200b may be a multiple channel system having any number of DRAM channels 214a, 214b and may include an asymmetric channel interleave component 216, an example of which is illustrated in FIG. 2B. The asymmetric channel interleave component 216 is also referred to herein as an asymmetric DRAM portion interleave component. The asymmetric channel interleave component 216 may be implemented in any combination of software, firmware, and/or hardware. The asymmetric channel interleave component 216 may be implemented as a stand-alone component of the computing device and/or may be an integral component of another component of the computing device, such as an SoC and/or a memory (e.g., memory 106, 114). The asymmetric channel interleave component 216 may be configured to control memory read and write accesses to the channels 214a, 214b by controlling the signals on communication busses 218a, 218b. For example, the asymmetric channel interleave component 216 may send memory read and write accesses to the channel 214a on the communication bus 218a, and send memory read and write accesses to the channel 214b on the communication bus 218b. The asymmetric channel interleave component 216 may implement DRAM portion interleaving for asymmetrically sized DRAM channels 214a, 214b by allocating interleave units in a manner that allows all of the portions of the DRAM to achieve DRAM usage efficiency improvements and that increases efficiency of PASR and/or PAAR by lowering refresh power, as described further herein.

In some embodiments, the DRAM system 200c may be a multiple channel system having any number of DRAM channels 214a, 214b and any number of DRAM ranks 204a, 204b, 204c, 204d, an example of which is illustrated in FIG. 2C. The channels 214a, 214b may include any number of the DRAM ranks 204a, 204b, 204c, 204d. The asymmetric channel interleave component 216 may implement DRAM portion interleaving for asymmetrically sized DRAM channels 214a, 214b, and the asymmetric rank interleave component 212a, 212b may cause the memory controller 202a, 202b to implement DRAM portion interleaving for asymmetrically sized DRAM ranks 204a, 204b, 204c, 204d, as described further herein.

Figure 3A:
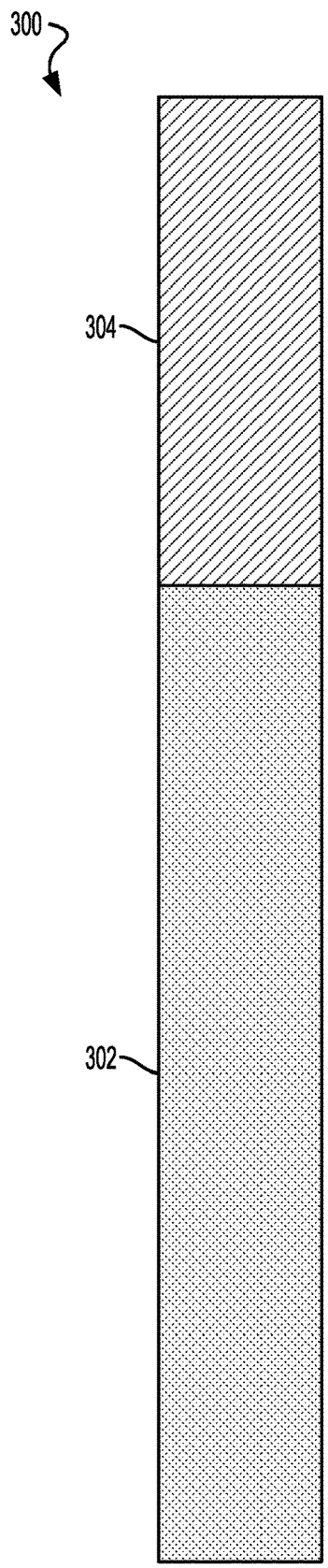
FIGS. 3A and 3B are block diagrams illustrating an example of existing linear to interleaved asymmetric DRAM rank mapping.
Figure 3B:
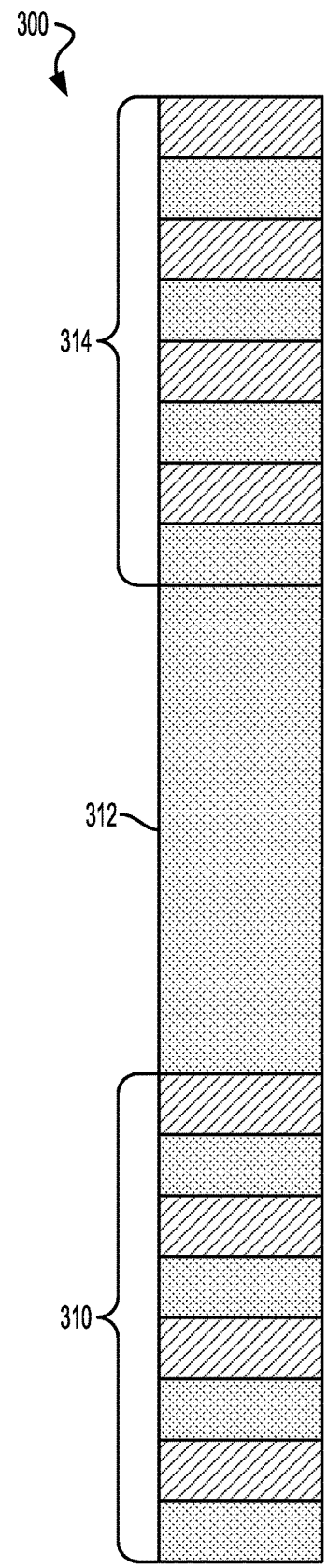

FIGS. 3A and 3B illustrate an example of existing linear to interleaved asymmetric DRAM rank mapping. This example is described in terms of two asymmetrically sized DRAM ranks, including a large DRAM rank and a small DRAM rank for which the large DRAM rank has a greater memory capacity than the small DRAM rank. Like shading in FIGS. 3A and 3B represent the whole and/or parts of the asymmetrically sized DRAM ranks. FIG. 3A illustrates an example of a linear asymmetric DRAM rank mapping, which includes a linear map of the large DRAM rank 302 to a memory space 300 and a linear map of the small DRAM rank 304 to the memory space 300. FIG. 3B illustrates an example of an interleaved asymmetric DRAM rank mapping, which includes interleaved maps of the asymmetric DRAM ranks 310, 314 to the memory space 300, and a linear map of the large DRAM rank 312 to the memory space 300.

The linear asymmetric DRAM rank mapping consecutively maps the entire large DRAM rank using the linear map of the large DRAM rank 302 to the memory space 300 and the entire small DRAM rank using the linear map of the small DRAM rank 304 to the memory space 300. The linear asymmetric DRAM rank mapping also consecutively maps the entire large DRAM rank and the entire small DRAM rank in relation to each other.

The interleaved asymmetric DRAM rank mapping maps equally sized first parts of the large DRAM rank and the small DRAM rank using the interleaved map of the asymmetric DRAM ranks 310 to the memory space 300 in an interleaved manner. Equally sized second parts of the large DRAM rank and the small DRAM rank are mapped using the interleaved map of the asymmetric DRAM ranks 314 to the memory space 300 in an interleaved manner. Equally sized interleave units of the first parts and the second parts of the large DRAM rank and the small DRAM rank are mapped in an equally alternating manner, such that an interleave unit from each DRAM rank is mapped before another interleave unit from each of the DRAM ranks is mapped. The first parts and the second parts of the large DRAM rank and the small DRAM rank are equally sized to each other. The interleaved asymmetric DRAM rank mapping also maps a third part of the large DRAM rank using the linear map of the large DRAM rank 312. The third part of the large DRAM rank is the amount of memory capacity by which the large DRAM rank exceeds the small DRAM rank.

DRAM usage efficiency is improved by using rank interleaving by spreading transactions directed to the DRAM across multiple DRAM ranks. As such, some parts of transactions to the DRAM can be implemented concurrently using different interleaved DRAM ranks, rather than sequentially using a single DRAM rank. However, the parts of the DRAM mapped in the linear manner using a single DRAM rank will not achieve the DRAM usage efficiency improvements because the transactions directed to the DRAM within the linear part of the DRAM rank are executed sequentially.

Figure 4C:
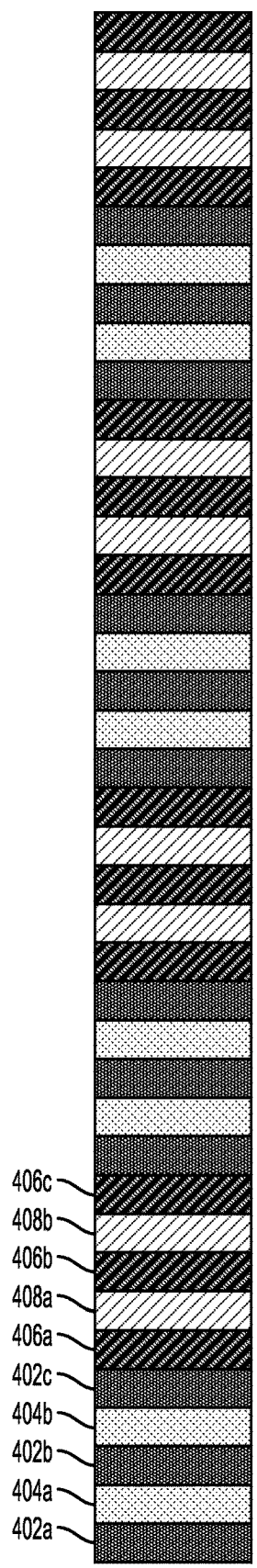
Figure 4D:
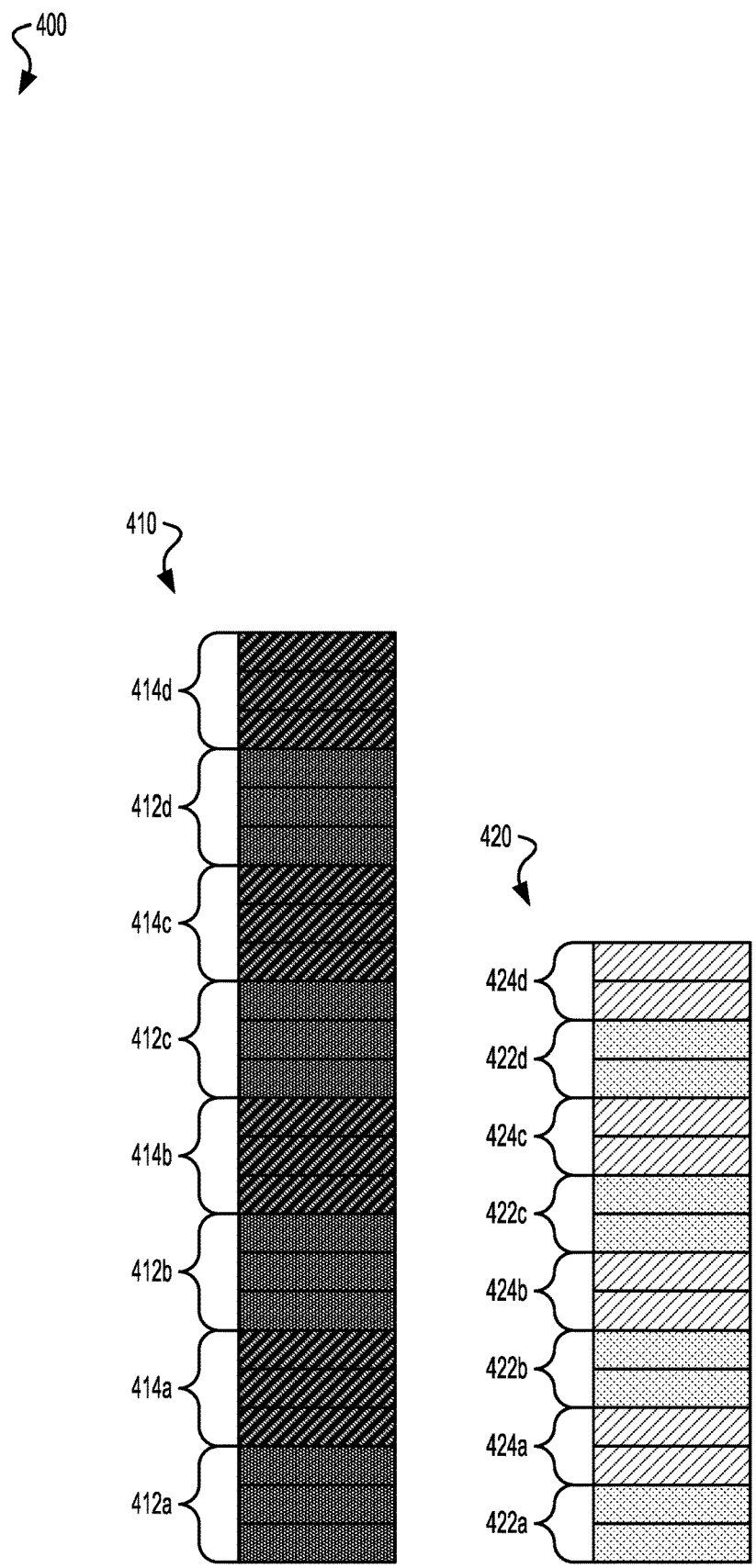

FIGS. 4A-4D illustrate examples of portion interleaving for asymmetric size DRAM portions suitable for implementing various embodiments. With reference to FIGS. 1-2C, these examples are described in terms of two asymmetrically sized DRAM portions, including a large DRAM portion and a small DRAM portion (e.g., DRAM rank 204a, 204b, 204c, 204d, DRAM channel 214a, 214b in FIGS. 2A-2C) for which the large DRAM portion has a greater memory capacity than the small DRAM portion. Like shading in FIGS. 4A and 4B and in FIGS. 4C and 4D represent portions of the asymmetrically sized DRAM portions.

FIGS. 4A and 4C illustrate examples of interleaved asymmetric DRAM portion mapping to a memory space 400, which may include interleaved parts of the large DRAM portion 402a, 402b, 402c, 406a, 406b, 406c mapped to the memory space 400 and interleaved parts of the small DRAM portion 404a, 404b, 408a, 408b mapped to the memory space 400. These interleaved parts 402a-402c, 404a, 404b, 406a-406c, 408a, 408b are referred to herein as interleave units. FIGS. 4B and 4D illustrate examples of interleaved asymmetric DRAM portion mapping to a large DRAM portion memory space 410, which may include the interleave units 402a-402c, 406a-406c of the large DRAM portion mapped to the large DRAM portion memory space 410 in groups of interleave granules 412a, 412b, 412c, 412d, 414a, 414b, 414c, 414d, referred to herein as interleave granules. The example further includes asymmetric DRAM portion mapping to a small DRAM portion memory space 420, which may include the interleave units 404a, 404b, 408a, 408b of the small DRAM portion mapped to the small DRAM portion memory space 420 in groups of interleave granules 422a, 422b, 422c, 422d, 424a, 424b, 424c, 424d, referred to herein as interleave granules. Embodiments of portion interleaving for asymmetric size DRAM portions may be applied to any number and combination of asymmetrically sized DRAM portions, where at least two of the DRAM portions are asymmetrically sized. Embodiments described in terms of two asymmetrically sized DRAM portions are intended as a non-limiting example and are not intended to limit the scope of the claims to only two asymmetrically sized DRAM portions.

Various embodiments of portion interleaving for asymmetric size DRAM portions may use an interleave granularity that may be different for different DRAM portions. The interleave granularity for the asymmetric DRAM portions may be a ratio the same as an asymmetric DRAM portion capacity ratio (R0:R1). The interleave granules 412a-412d, 414a-414d of the large DRAM portion and the interleave granules 422a-422d, 424a-424d of the small DRAM portion may be sized based on the asymmetric DRAM portion capacity ratio. For example, interleave granules 412a-412d, 414a-414d, 422a-422d, 424a-424d of the DRAM portion may include R0 or R1 interleave units 402a-402c, 404a, 404b, 406a-406c, 408a, 408b.

In some embodiments, as illustrated in FIGS. 4A and 4B, portion interleaving for asymmetric size DRAM portions may assign R0 consecutive interleave units 402a-402c, 404a, 404b, 406a-406c, 408a, 408b to the memory space 400 and R1 consecutive interleave units 402a-402c, 404a, 404b, 406a-406c, 408a, 408b to the memory space 400. In some embodiments, portion interleaving for asymmetric size DRAM portions may assign R0 consecutive interleave units 402a-402c, 406a-406c to the large DRAM portion memory space 410 and R1 consecutive interleave units 404a, 404b, 408a, 408b to the small DRAM portion memory space 420. In some embodiments, portion interleaving for asymmetric size DRAM portions may assign R0 consecutive interleave units 404a, 404b, 408a, 408b to the small DRAM portion memory space 420 and R1 consecutive interleave units 402a-402c, 406a-406c to the large DRAM portion memory space 410. Assigning the R0 or R1 consecutive interleave units 402a-402c, 404a, 404b, 406a-406c, 408a, 408b to a memory space 400, 410, 420 may also involve assigning interleave units 402a-402c, 404a, 404b, 406a-406c, 408a, 408b to the DRAM portion memory spaces 410, 420 in interleave granules 412a-412d, 414a-414d, 422a-422d, 424a-424d.

As described further herein, the addresses for the interleave units 402a-402c, 404a, 404b, 406a-406c, 408a, 408b within each memory space 400, 410, 420 may be increased linearly so that no unused memory space is left in the memory space 400, 410, 420 between interleave units 402a-402c, 404a, 404b, 406a-406c, 408a, 408b. Addresses for the interleave units 402a-402c, 404a, 404b, 406a-406c, 408a, 408b may be mapped from the memory space 400 to the DRAM portion memory spaces 410, 420 in a manner that increase the addresses linearly within the DRAM portion memory spaces 410, 420. Successive assignments of interleave units 402a-402c, 404a, 404b, 406a-406c, 408a, 408b and/or the interleave granules 412a-412d, 414a-414d, 422a-422d, 424a-424d to the memory space 400, 410, 420 may continue in a similar manner.

In some embodiments, as illustrated in FIGS. 4C and 4D, portion interleaving for asymmetric size DRAM portions may assign R0 non-consecutive interleave units 402a-402c, 404a, 404b, 406a-406c, 408a, 408b to the memory space 400 and R1 non-consecutive interleave units 402a-402c, 404a, 404b, 406a-406c, 408a, 408b to the memory space 400. In some embodiments, portion interleaving for asymmetric size DRAM portions may assign R0 non-consecutive interleave units 402a-402c, 406a-406c to the large DRAM portion memory space 410, and assign R1 non-consecutive interleave units 404a, 404b, 408a, 408b to the small DRAM portion memory space 420. In some embodiments, portion interleaving for asymmetric size DRAM portions may assign R0 non-consecutive interleave units 404a, 404b, 408a, 408b to the small DRAM portion memory space 420, and assign R1 non-consecutive interleave units 402a-402c, 406a-406c to the large DRAM portion memory space 410. Assigning the R0 or R1 non-consecutive interleave units 402a-402c, 404a, 404b, 406a-406c, 408a, 408b to a memory space 400, 410, 420 may also involve assigning interleave units 402a-402c, 404a, 404b, 406a-406c, 408a, 408b to the DRAM portion memory spaces 410, 420 in interleave granules 412a-412d, 414a-414d, 422a-422d, 424a-424d.

As described further herein, the addresses for the interleave granules 412a-412d, 414a-414d, 422a-422d, 424a-424d within each memory space 400, 410, 420 may be increased linearly so that no unused memory space is left in the memory space 400, 410, 420 between the interleave granules 412a-412d, 414a-414d, 422a-422d, 424a-424d. Addresses for the interleave units 402a-402c, 404a, 404b, 406a-406c, 408a, 408b may be mapped from the memory space 400 to the DRAM portion memory spaces 410, 420 in a manner that increase the addresses of the interleave granules 412a-412d, 414a-414d, 422a-422d, 424a-424d linearly within the DRAM portion memory spaces 410, 420. For example, the group of interleave granules 412a-412d, 414a-414d, 422a-422d, 424a-424d may contain the interleave units 402a-402c, 404a, 404b, 406a-406c, 408a, 408b in any order while the addresses of the interleave granules 412a-412d, 414a-414d, 422a-422d, 424a-424d increases linearly. Successive assignments of interleave granules 402a-402c, 404a, 404b, 406a-406c, 408a, 408b to the memory space 400, 410, 420 may continue in a similar manner.

The examples described herein are explained using a 3:2 asymmetric DRAM portion capacity ratio of the large DRAM portion memory space 410 to the small DRAM portion memory space 420, which could otherwise be any asymmetric DRAM portion capacity ratio and does not limit the scope of the claims or specification to the size or order of the asymmetric DRAM portions used for the asymmetric DRAM portion capacity ratio. In this example, the interleave granules of the large DRAM portion 412a-412d, 414a-414d are sized such that they each include three interleave units 402a-402c, 406a-406c allocated to the large DRAM portion memory space 410, and the interleave granules of the small DRAM portion 422a-422d, 424a-424d are sized such that they each include two interleave granules 404a, 404b, 408a, 408b allocated to the small DRAM portion memory space 420. All of the interleave units 402a-402c, 404a, 404b, 406a-406c, 408a, 408b may be of equal size.

In some embodiments, as illustrated in FIGS. 4A and 4B, the interleave units 402a-402c, 406a-406c for the large DRAM portion and the interleave units 404a, 404b, 408a, 408b for the small DRAM portion may be assigned to the memory space 400 in a manner that corresponds to the interleave granules 412a-412d, 414a-414d, 422a-422d, 424a-424d alternating between the DRAM portion memory spaces 410, 420. The interleave units 402a-402c, 404a, 404b, 406a-406c, 408a, 408b may be assigned to the memory space 400 in a manner in which the addresses of the interleave units 402a-402c, 404a, 404b, 406a-406c, 408a, 408b corresponding to the interleave granules 412a-412d, 414a-414d, 422a-422d, 424a-424d increase linearly. The assigning of memory space may be accomplished so that there is no unused memory space in the memory space 400 between the interleave units 402a-402c, 404a, 404b, 406a-406c, 408a, 408b.

The interleave units 402a-402c, 406a-406c for the large DRAM portion assigned in the memory space 400 may be mapped to the large DRAM portion memory space 410. The addresses of the interleave units 402a-402c, 406a-406c for the large DRAM portion in the memory space 400 may be mapped to the large DRAM portion memory space 410 so that the addresses of the interleave units 402a-402c, 406a-406c in the large DRAM portion memory space 410 increase linearly. The interleave units 402a-402c, 406a-406c for the large DRAM portion assigned in the memory space 400 may be mapped to interleave granules 412a-412d, 414a-414d in the large DRAM portion memory space 410. The addresses of the interleave units 402a-402c, 406a-406c for the large DRAM portion in the memory space 400 may be mapped so that the addresses of the interleave granules 412a-412d, 414a-414d in the large DRAM portion memory space 410 increase linearly. The assigning of memory space may be accomplished so that there is no unused memory space in the large DRAM portion memory space 410 between the interleave units 402a-402c, 406a-406c and between the interleave granule 412a-412d, 414a-414d.

The interleave units 404a, 404b, 408a, 408b for the small DRAM portion assigned in the memory space 400 may be mapped to the small DRAM portion memory space 420. The addresses of the interleave units 404a, 404b, 408a, 408b for the small DRAM portion in the memory space 400 may be mapped so that the addresses of the interleave units 404a, 404b, 408a, 408b in the small DRAM portion memory space 420 increase linearly. The interleave units 404a, 404b, 408a, 408b for the small DRAM portion assigned in the memory space 400 may be mapped to interleave granules 422a-422d, 424a-424d in the small DRAM portion memory space 420. The addresses of the interleave units 404a, 404b, 408a, 408b for the small DRAM portion in the memory space 400 may be mapped so that the addresses of the interleave granules 422a-422d, 424a-424d in the small DRAM portion memory space 420 increase linearly. The assigning of memory space may be accomplished so that there is no unused memory space in the small DRAM portion memory space 420 between the interleave units 404a, 404b, 408a, 408b and between the interleave granules 422a-422d, 424a-424d.

In some embodiments, as illustrated in FIGS. 4C and 4D, the interleave units 402a-402c, 406a-406c for the large DRAM portion and the interleave units 404a, 404b, 408a, 408b for the small DRAM portion may be assigned to the memory space 400 in manner that does not correspond to the interleave granules 412a-412d, 414a-414d, 422a-422d, 424a-424d in the DRAM portion memory spaces 410, 420. The interleave units 402a-402c, 404a, 404b, 406a-406c, 408a, 408b may be assigned to the memory space 400 in manner in which the addresses of the interleave units increase linearly. The assigning of memory space may be accomplished so that there is no unused memory space in the memory space 400 between the interleave units 402a-402c, 404a, 404b, 406a-406c, 408a, 408b.

The interleave units 402a-402c, 406a-406c for the large DRAM portion assigned in the memory space 400 may be mapped to the large DRAM portion memory space 410. The addresses of the interleave units 402a-402c, 406a-406c for the large DRAM portion in the memory space 400 may be mapped so that the addresses of the interleave granules 412a-412d, 414a-414d in the large DRAM portion memory space 410 increase linearly. The interleave units 402a-402c, 406a-406c mapped in an interleave granule 412a-412d, 414a-414d may be mapped in any order. For example, the interleave units 402a-402c, 406a-406c may be mapped linearly to an interleave granule 412a-412d, 414a-414d. For another example, the interleave units 402a-402c, 406a-406c may be mapped non-linearly to an interleave granule 412a-412d, 414a-414d. The assigning of memory space may be accomplished so that there is no unused memory space in the large DRAM portion memory space 410 between the interleave granules 412*a*-412*d*, 414*a*-414*d*.

The interleave units 404*a*, 404*b*, 408*a*, 408*b* for the small DRAM portion assigned in the memory space 400 may be mapped to the small DRAM portion memory space 420. The addresses of the interleave units 404*a*, 404*b*, 408*a*, 408*b* for the small DRAM portion in the memory space 400 may be mapped so that the addresses of the interleave granules 422*a*-422*d*, 424*a*-424*d* in the small DRAM portion memory space 420 increase linearly. The interleave units 404*a*, 404*b*, 408*a*, 408*b* mapped in an interleave granule 422*a*-422*d*, 424*a*-424*d* may be mapped in any order. For example, the interleave units 404*a*, 404*b*, 408*a*, 408*b* may be mapped linearly to an interleave granule 422*a*-422*d*, 424*a*-424*d*. For another example, the interleave units 404*a*, 404*b*, 408*a*, 408*b* may be mapped non-linearly to an interleave granule 422*a*-422*d*, 424*a*-424*d*. The assigning of memory space may be accomplished so that there is no unused memory space in the small DRAM portion memory space 420 between the interleave granules 422*a*-422*d*, 424*a*-424*d*.

A memory management scheme may map refresh segments in the memory space 400 that are larger than the interleave granules 412*a*-412*d*, 422*a*-422*d*, 414*a*-414*d*, 424*a*-424*d*. As such, each refresh segment can include any number of the interleave granules 412*a*-412*d*, 422*a*-422*d*, 414*a*-414*d*, 424*a*-424*d*. A refresh segment can also span across the large DRAM portion memory space 410 and the small DRAM portion memory space 420. Implementing the embodiments of portion interleaving for asymmetric size DRAM portions may compact more interleave granules 412*a*-412*d*, 422*a*-422*d*, 414*a*-414*d*, 424*a*-424*d* into smaller portions of the memory space 400, 410, 420 for the same amount of data and same memory transactions as compared to current asymmetric DRAM rank or DRAM channel interleaving schemes.

A memory management scheme using PASR may disable refresh for refresh segments in the memory space 400, 410, 420 that do not include any interleave units 402*a*-402*c*, 404*a*, 404*b*, 406*a*-406*c*, 408*a*, 408*b* or interleave granules 412*a*-412*d*, 422*a*-422*d*, 414*a*-414*d*, 424*a*-424*d*. Implementing the embodiments of portion interleaving for asymmetric size DRAM portions may compact more interleave units 402*a*-402*c*, 404*a*, 404*b*, 406*a*-406*c*, 408*a*, 408*b* or interleave granules 412*a*-412*d*, 422*a*-422*d*, 414*a*-414*d*, 424*a*-424*d* into fewer refresh segments than existing interleaved asymmetric DRAM rank or DRAM channel mapping. Less memory space 400, 410, 420 may need to be refreshed for the fewer refresh segments by excluding unused memory space from the refresh segments. Using PASR to disable refresh for a refresh segment without any interleave units 402*a*-402*c*, 404*a*, 404*b*, 406*a*-406*c*, 408*a*, 408*b* or interleave granules 412*a*-412*d*, 422*a*-422*d*, 414*a*-414*d*, 424*a*-424*d* and/or reducing the number of refresh segments to refresh reduces wasted energy used for refreshing unused portions of the memory space 400, 410, 420. Similar memory management schemes, such as PAAR, may similarly benefit from eliminating refresh of refresh segments having unused memory space and/or reducing the number of refresh segments to refresh.

DRAM usage efficiency is improved by using DRAM rank or DRAM channel interleaving by spreading transactions directed to the DRAM across multiple DRAM ranks or DRAM channels. As such, some parts of transactions to the DRAM may be implemented concurrently using different DRAM ranks or DRAM channels, rather than sequentially using a single DRAM rank or DRAM channel. The embodiments of portion interleaving for asymmetric size DRAM portions may allow all used parts of the DRAM to achieve the DRAM usage efficiency improvements by providing interleaving throughout the DRAM.

Figure 5:
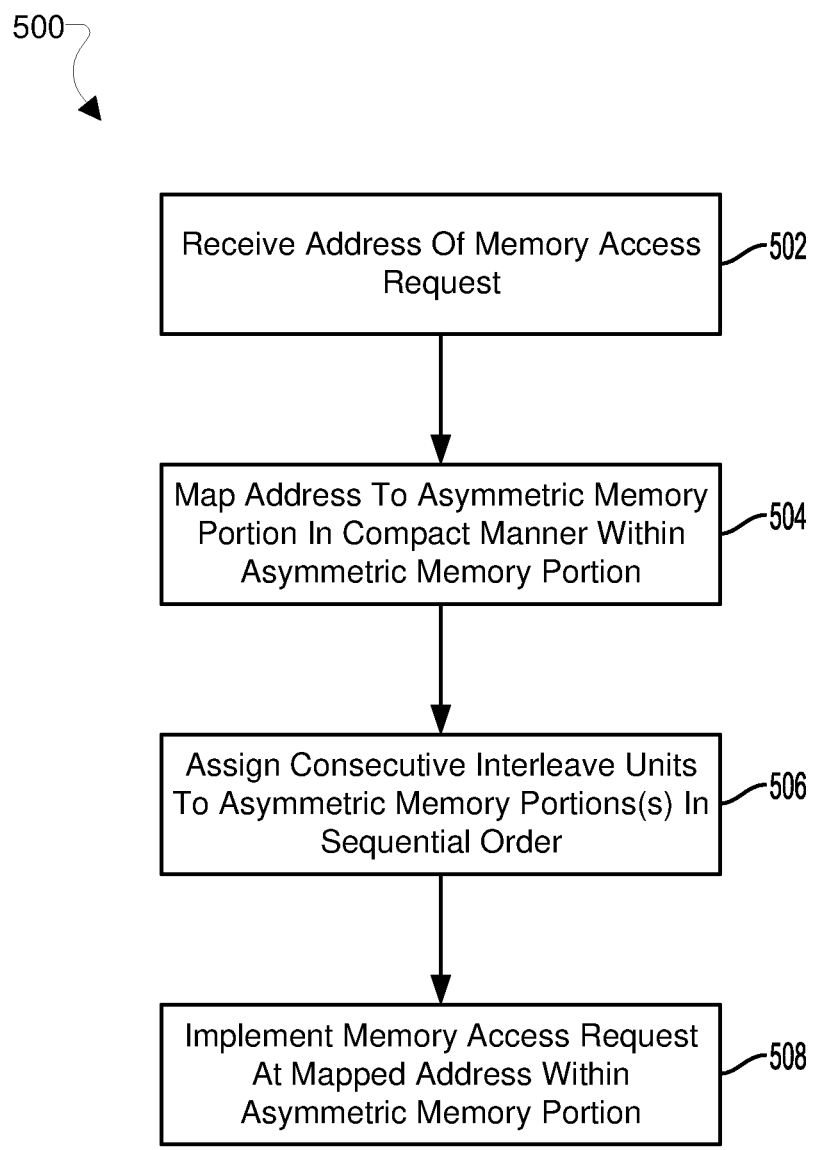
FIG. 5 is a process flow diagram illustrating a method for DRAM portion interleaving for asymmetric size DRAM portion according to an embodiment.

FIG. 5 illustrates a method 500 for portion interleaving for asymmetric size DRAM portions according to an embodiment. With reference to FIGS. 1-2C and 4A-5, the method 500 may be implemented in a computing device (e.g., computing device 100 in FIG. 1), in hardware (e.g., SoC 102, CPU 104, memory 106, 114, memory interface 110, processor 124, in FIG. 1, memory controller 202*a*, 202*b*, DRAM rank 204*a*, 204*b*, 204*c*, 204*d*, asymmetric rank interleave component 212*a*, 212*b*, asymmetric channel interleave component 216 in FIGS. 2A-2C), in software executing in a processor (e.g., memory controller 202*a*, 202*b*, asymmetric rank interleave component 212*a*, 212*b*, DRAM channel 214*a*, 214*b*, asymmetric channel interleave component 216 in FIGS. 2A-2C), or in a combination of a software-configured processor and dedicated hardware (e.g., memory controller 202*a*, 202*b*, asymmetric rank interleave component 212*a*, 212*b*, asymmetric channel interleave component 216 in FIGS. 2A-2C) that includes other individual components, and various memory/cache controllers (e.g., memory controller 202*a*, 202*b* in FIG. 2). In order to encompass the alternative configurations enabled in various embodiments, the hardware implementing the method 500 is referred to herein as an "memory control device."

In block 502, the memory control device may receive an address of memory access request. The memory control device may receive the address of memory access request in conjunction with a memory access request to a memory, which may include a DRAM. In some embodiments, the memory control device receiving the address of memory access request in block 502 may be a CPU, a processor, a memory controller, an asymmetric rank interleave component, and/or an asymmetric channel interleave component.

In block 504, the memory control device may map the address to an asymmetric memory portion in a compact manner within the asymmetric memory portion. In some embodiments, mapping the address to the asymmetric memory portion may involve functions using the address. In some embodiments, the address used by the functions may be the address received in block 502 excluding a column address portion and a bank address portion of the address. In some embodiments, the address used by the functions may be a number of the bits of the address. For example, the address used by the functions may be 8 or 9 most significant bits of the address. For another example, the address used by the functions may be 3 to 4 of the most significant bits of a row address portion of the address and 3 or 4 bits most significant bits succeeding the bank address portion of the address. The memory control device may map the address to the asymmetric memory portion in the compact manner within the asymmetric memory portion as further described in the methods 600, 700, 800 with reference to FIGS. 6-8. In some embodiments, the memory control device mapping the address to the asymmetric memory portion in the compact manner within the asymmetric memory in block 504 may be a CPU, a processor, and/or a memory controller.

In block 506, the memory control device may assign consecutive interleave units to an asymmetric memory portion(s) (e.g., DRAM rank 204*a*, 204*b*, 204*c*, 204*d*, DRAM channel 214*a*, 214*b* in FIGS. 2A-2C) in a sequential order. The memory control device may assign consecutive interleave units to the asymmetric memory portion(s) in the sequential order as further described in the method 800 with reference to FIG. 8. In some embodiments, the memory control device receiving assigning consecutive interleave units to the asymmetric memory portion(s) in the sequential order in block 504 may be a CPU, a processor, a memory controller, an asymmetric rank interleave component, and/or an asymmetric channel interleave component.

In block 508, the memory control device may implement the memory access request at the mapped address within the asymmetric memory portion. The memory control device may implement, for example, a read and/or write memory access request at the address mapped address within the asymmetric memory portion. In some embodiments, the memory control device may send a command, the mapped address, and/or data to an asymmetric memory channel on a communication bus (e.g., communication busses 218a, 218b in FIGS. 2B and 2C). The memory control device may send the command and/or the mapped address to a memory rank(s) of the asymmetric memory channel on a command and address bus (e.g., command and address bus 206a, 20b in FIGS. 2B and 2C). The memory control device may send data to and/or receive data from the memory rank(s) of the asymmetric memory channel on a data bus (e.g., data bus 208a, 208b in FIGS. 2B and 2C). In some embodiments, the memory control device may send a chip select signal on a dedicated chip select line (e.g., dedicated chip select line 210a, 210b, 210c, 210d in FIG. 2C) to a memory rank of the asymmetric memory channel configured to control whether the memory rank receives the command, the mapped address, and/or the data. In some embodiments, the memory control device may send a command and/or the mapped address to asymmetric memory ranks on a command and address bus (e.g., command and address bus 206a in FIG. 2A). The memory control device may send data to and/or receive data from the asymmetric memory ranks on a data bus (e.g., data bus 208a in FIG. 2A). The memory control device may send a chip select signal on a dedicated chip select line (e.g., dedicated chip select line 210a, 210b in FIG. 2A) to an asymmetric memory rank configured to control whether the asymmetric memory rank receives the command, the mapped address, and/or the data. In some embodiments, the memory control device implementing the memory access request at the mapped address within the asymmetric memory portion in block 508 may be a CPU, a processor, a memory controller, an asymmetric rank interleave component, and/or an asymmetric channel interleave component.

Figure 6:
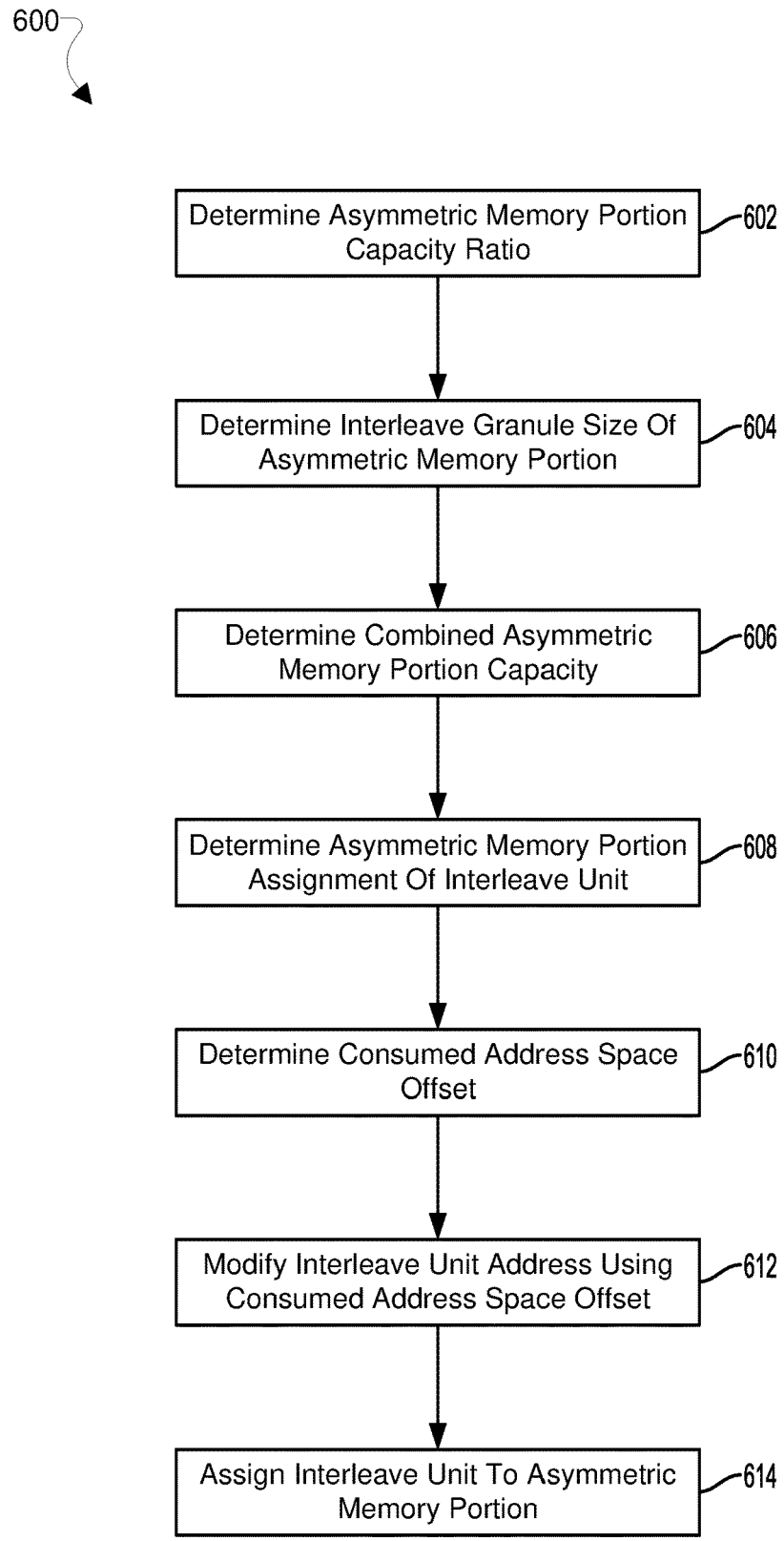
FIG. 6 is a process flow diagram illustrating a method for assigning consecutive interleave units to asymmetric DRAM portions in a compact manner according to an embodiment.

FIG. 6 illustrates a method 600 for assigning consecutive interleave units to asymmetric DRAM portions in a compact manner according to an embodiment. With reference to FIGS. 1-2C and 4A-6, the method 600 may be implemented in a computing device (e.g., computing device 100 in FIG. 1), in hardware (e.g., SoC 102, CPU 104, memory 106, 114, memory interface 110, processor 124, in FIG. 1, memory controller 202a, 202b, DRAM rank 204a, 204b, 204c, 204d, asymmetric rank interleave component 212a, 212b, asymmetric channel interleave component 216 in FIGS. 2A-2C), in software executing in a processor (e.g., memory controller 202a, 202b, asymmetric rank interleave component 212a, 212b, DRAM channel 214a, 214b, asymmetric channel interleave component 216 in FIGS. 2A-2C), or in a combination of a software-configured processor and dedicated hardware (e.g., memory controller 202a, 202b, asymmetric rank interleave component 212a, 212b, asymmetric channel interleave component 216 in FIGS. 2A-2C) that includes other individual components, and various memory/cache controllers (e.g., memory controller 202a, 202b in FIG. 2). In order to encompass the alternative configurations enabled in various embodiments, the hardware implementing the method 600 is referred to herein as an "memory control device."

In block 602, the memory control device may determine an asymmetric memory portion capacity ratio. In some embodiments, the capacity of multiple asymmetric memory portions (e.g., DRAM rank 204a, 204b, 204c, 204d, DRAM channel 214a, 214b in FIGS. 2A-2C) may be known to the memory control device, such as stored in an accessible memory. For example, the capacity of an asymmetric memory portion may be stored on a read-only memory, which may be an integral portion of the memory (e.g., memory 106, 114 in FIG. 1) having and/or included in the asymmetric memory portion. In some embodiments, the capacity of multiple asymmetric memory portions may be determined by the memory control device. The memory control device may compare the sizes of the asymmetric memory portions to determine the asymmetric memory portion capacity ratio. In some embodiments, the asymmetric memory portion capacity ratio may be known to the memory control device, such as stored in an accessible memory, and retrieved by the memory control device to determine the asymmetric memory portion capacity ratio. For example, the asymmetric memory portion capacity ratio may be previously determined, such as in block 702 of the method 700 described herein with reference to FIG. 7, as stored to a register or a buffer, which may be a portion of the memory. In some embodiments, the asymmetric memory portion capacity of a first asymmetric memory portion may be represented as "R0", the asymmetric memory portion capacity of a second asymmetric memory portion may be represented as "R1", and the asymmetric memory portion capacity ratio may equal R0:R1. In some embodiments, the memory control device determining the asymmetric memory portion capacity ratio in block 602 may be a CPU, a processor, a memory controller, an asymmetric rank interleave component, and/or an asymmetric channel interleave component.

In block 604, the memory control device may determine an interleave granule size of an asymmetric memory portion. The interleave granule size of the asymmetric memory portion may correspond to the asymmetric memory portion capacity ratio. For example, the interleave granule size of the asymmetric memory portion may be a function of the value of the asymmetric memory portion capacity ratio representing the capacity of the asymmetric memory portion. The interleave granule size of the asymmetric memory portion may be a number of interleave units (e.g., interleave units 402a-402c, 404a, 404b, 406a-406c, 408a, 408b in FIGS. 4A and 4C) and/or an amount of memory that is a result of the function of the value of the asymmetric memory portion capacity ratio representing the capacity of the asymmetric memory portion. In some embodiments, the memory control device determining the interleave granule size of the asymmetric memory portion in block 604 may be a CPU, a processor, a memory controller, an asymmetric rank interleave component, and/or an asymmetric channel interleave component.

In block 606, the memory control device may determine a combined asymmetric memory portion capacity. In some embodiments, the combined asymmetric memory portion capacity may be known to the memory control device, such as stored in an accessible memory, and retrieved by the memory control device to determine the combined asymmetric memory portion capacity. For example, the combined asymmetric memory portion capacity may be stored on a read-only memory, which may be an integral portion of the memory having and/or included in the asymmetric memory portions. In some embodiments, the combined asymmetric memory portion capacity may be determined by the memory control device. The memory control device may combine the sizes of the asymmetric memory portions to determine the combined asymmetric memory portion capacity ratio. In some embodiments, the combined asymmetric memory portion capacity ratio may be represented as "Rsum" where Rsum=R0+R1. In some embodiments, the memory control device determining the combined asymmetric memory portion capacity in block 606 may be a CPU, a processor, a memory controller, an asymmetric rank interleave component, and/or an asymmetric channel interleave component.

In block 608, the memory control device may determine an asymmetric memory portion assignment of an interleave unit. In some embodiments, the memory control device determining the asymmetric memory portion assignment of the interleave unit in block 608 may be a CPU, a processor, a memory controller, an asymmetric rank interleave component, and/or an asymmetric channel interleave component. In some embodiments, the asymmetric memory portion assignment of an interleave unit may depend on the interleave granule size. As interleave granules may be sized to correspond with the asymmetric memory portion capacity ratio, certain interleave granules may be suited for certain asymmetric memory portions. In particular, for interleave granules sized using the function of the value of the asymmetric memory portion capacity ratio representing the capacity of an asymmetric memory portion, the interleave granule may be suited for the asymmetric memory portion. An interleave granule for an asymmetric memory portion may be sized such that a certain number of interleave units fit within the interleave granule. Once the number of interleave units are assigned in one asymmetric memory portion, a next number of interleave units may be assigned to another asymmetric memory portion with another interleave granule size.

In some embodiments, addresses of a memory space (e.g., memory space 400 in FIGS. 4A and 4C) corresponding to a memory (e.g., memory 106, 114 in FIG. 1) may be mapped to individual asymmetric memory portion memory spaces (e.g., DRAM portion memory space 410, 420 in FIGS. 4B and 4D) corresponding to individual asymmetric memory portions. In some embodiments, the addresses of the memory space may be divided among the asymmetric memory portions corresponding to a function of the combined asymmetric memory portion capacity "Rsum" and the asymmetric memory portion capacity ratio. For example, an amount of the addresses of the memory space assigned to an asymmetric memory portion memory space may be a function of the value of the asymmetric memory portion capacity ratio representing the capacity of the asymmetric memory portion. For example, the amount of the addresses of the memory space assigned to a first asymmetric memory portion memory space may equal R0/Rsum of the memory space and the amount of the addresses of the memory space assigned to a second asymmetric memory portion memory space may equal R1/Rsum of the memory space. In some embodiments, the combined asymmetric memory portion capacity may be known to the memory control device, such as stored in an accessible memory, and retrieved by the memory control device to determine the asymmetric memory portion assignment of an interleave unit. For example, the combined asymmetric memory portion capacity may be previously determined, such as in block 704 of the method 700 described herein with reference to FIG. 7, as stored to a register or a buffer, which may be a portion of the memory. In some embodiments, specific address assignments to the asymmetric memory portion may be determined as a function of the combined asymmetric memory portion capacity, the capacity of an asymmetric memory portion, and/or the asymmetric memory portion capacity ratio.

Addresses of an interleave unit "IUAddress" may be mapped to an asymmetric memory portion based on mapping the addresses of the memory space to the asymmetric memory portions. For a specific and nonlimiting example, a modulus of the address modulo the combined asymmetric memory portion capacity, Mod=IUAddress % Rsum, may be compared to the asymmetric memory portion capacity ratio value of an asymmetric memory portion to determine to which asymmetric memory portion to assign the interleave unit. For example, a modulus that is smaller than the asymmetric memory portion capacity ratio value of an asymmetric memory portion may indicate to the memory control device that the interleave unit may be assigned to the asymmetric memory portion. For example, Mod<R0 may indicate to the memory control device that the interleave unit may be assigned to the first asymmetric memory portion. For two asymmetric memory portions, the modulus that is not smaller than the asymmetric memory portion capacity ratio value of an asymmetric memory portion may indicate to the memory control device that the interleave unit may be assigned to the other of the asymmetric memory portions. For example, Mod≥R0 may indicate to the memory control device that the interleave unit may be assigned to the second asymmetric memory portion. For more than two asymmetric memory portions, further modulus comparisons to asymmetric memory portion capacity ratio values of asymmetric memory portions may indicate to the memory control device that the interleave unit may be assigned to specific asymmetric memory portions. In some embodiments, the asymmetric memory portion assignment of an interleave unit may be the same as the asymmetric memory portion assignment, as determined in block 706 of the method 700 described with reference to FIG. 7, for the address of the received memory access request in block 502 of the method 500 described with reference to FIG. 5.

In block 610, the memory control device may determine a consumed address space offset. In some embodiments, the memory control device determining the consumed address space offset in block 610 may be a CPU, a processor, a memory controller, an asymmetric rank interleave component, and/or an asymmetric channel interleave component. An interleave unit may be addressed based on the memory space corresponding to the memory. However, each asymmetric memory portion memory space corresponding to an individual asymmetric memory portion may be differently addressed in comparison to the memory space. Further, with the memory space being divided among multiple asymmetric memory portion memory spaces, an amount of consumed memory space may not correspond to an amount of consumed asymmetric memory portion memory space. To map an interleave units based on the addresses of the memory space to an asymmetric memory portion memory space in a compact manner, the noncorresponding consumed memory space may be accounted for. For example, the amount of consumed memory of the memory space that does not correspond with the consumed memory of the asymmetric memory portion memory space may be removed for determining the address in the asymmetric memory portion memory space to which to map the interleave unit of the memory space. In some embodiments, the amount of consumed memory of the memory space that does not correspond with the consumed memory of the asymmetric memory portion memory space may be an amount of consumed memory of a different asymmetric memory portion memory space. This amount of noncorresponding consumed memory may be the consumed address space offset.

For a specific and nonlimiting example, an address of an interleave unit in the memory space "IUAddress", such as a lower bound address, may be divided by a combined asymmetric memory portion capacity, Rsum. The resulting quotient "Div" may be used in a function to determine the consumed address space offset. For example, Div=IUAddress/Rsum. In some embodiments, the function may use a different variable based on to which asymmetric memory portion an address corresponding to the interleave unit is assigned, as determined in block 608. For example, the consumed address space offset for an address of an interleave unit assigned to an asymmetric memory portion "Offset" may be the product of the quotient multiplied by a value of the asymmetric memory portion capacity ratio representing capacity of a different asymmetric memory portion, as determined in block 602, summed with a function of the modulus, as determined in block 608. For example, Offset=(Portion0)?(Div*R1+Mod>>1):(Div*R0+Mod>>1+ 1). In some embodiments, the Offset may be determined in various other manners that may represent consumed memory space.

In block 612, the memory control device may modify the address of the interleave unit "IUAddress" using the consumed address space offset "Offset", as determined in block 610. In some embodiments, the address may be modified to an address and/or a range of addresses within the assigned asymmetric memory portion memory space based on the amount of consumed memory space of the asymmetric memory portion to which the interleave unit is assigned in block 608. In some embodiments, the address of the interleave unit may be modified to an address and/or a range of addresses within the asymmetric memory portion memory space to which the interleave unit is assigned in block 608. In some embodiments, the address of the interleave unit may be modified to an address and/or a range of addresses within an interleave granule (e.g., interleave granule 412*a*-412*d*, 414*a*-414*d* in FIGS. 4B and 4D), an amount of the asymmetric memory portion memory space, to which the interleave unit is assigned, of the interleave granule size for the asymmetric memory portion memory space, as determined in block 604. Addresses of multiple interleave units may be modified to be mapped to the interleave granule in any order. For example, addresses of multiple interleave units may be modified to be mapped to the interleave granule in a non-linear manner. As another example, addresses of multiple interleave units may be modified to be mapped to the interleave granule in a linear manner. Addresses of interleave units may continue to be modified to be mapped to the interleave granule until the interleave granule is full. For example, a full interleave granule may have no unused asymmetric memory portion memory space between interleave units. In some embodiments, no address of an interleave unit may be modified to be mapped to another interleave granule of any of the asymmetric memory portion memory spaces until the interleave granule is full. Modification of the addresses of interleave units in such a manner may reduce a number of refresh segments used for a number of interleave units compared to existing rank or channel interleaving. Refresh schemes, like PASR or PAAR, may be enabled refresh for the fewer refresh segments and disable refresh for more unused refresh segments. Refresh may be enabled for a refresh segment following full utilization of a refresh segment for which refresh was previously enabled.

In some embodiments, the address of the interleave unit may be modified to correspond to the amount of consumed memory space of the asymmetric memory portion to which it is assigned. In some embodiments, the address of the interleave unit may be modified to be within a range of addresses of the interleave granule for the asymmetric memory portion memory space to which the interleave unit is assigned that is linearly successive or consecutive with the consumed memory space of the asymmetric memory portion. In some embodiments, such modification of the address of the interleave unit may be non-linear within the range of addresses of the interleave granule. For example, the address of the interleave unit may be modified to be non-linear with a previously mapped interleave unit in the interleave granule and/or between interleave granules for the for the asymmetric memory portion memory space. As such, multiple interleave granules of the asymmetric memory portion memory space may be linear, without any unused memory space between the interleave granules of the asymmetric memory portion memory space, while each successive interleave granule of the asymmetric memory portion memory space may be filled in a non-linear manner.

In some embodiments, the address of the interleave unit may be modified to be linearly successive or consecutive with the consumed memory space of the asymmetric memory portion to which it is assigned. As such, multiple interleave units of the asymmetric memory portion memory space may be linear, without any unused memory space between the interleave units of the asymmetric memory portion memory space. For example, the address of the interleave unit may be modified to be linear with a previously mapped interleave unit. By extension, multiple interleave granules of the asymmetric memory portion memory space may be linear, without any unused memory space between the interleave granules of the asymmetric memory portion memory space, while each successive interleave granule of the asymmetric memory portion memory space may be filled in a linear manner. For example, the modified address of the interleave unit "MapIUAddress" may be the difference between the address of the interleave unit and the consumed address space offset. For example, MapIUAddress=IUAddress−Offset. In some embodiments, the MapIUAddress may be determined in various other manners that may account for the consumed memory space. In some embodiments, the memory control device modifying the address of the interleave unit using the consumed address space offset in block 612 may be a CPU, a processor, a memory controller, an asymmetric rank interleave component, and/or an asymmetric channel interleave component.

In block 614, the memory control device may assign the interleave unit to the asymmetric memory portion. The memory control device may assign the interleave unit to the asymmetric memory portion, as determined in block 608. The memory control device may assign the interleave unit to the modified address of the interleave unit in the asymmetric memory portion memory space, as determined in block 612. In some embodiments, the memory control device may assign the interleave unit to the asymmetric memory portion in a non-linear manner to a previously assigned memory interleave unit in the asymmetric memory portion. In some embodiments, the memory control device may assign the interleave unit to the asymmetric memory portion in a linear manner to a previously assigned memory interleave unit in the asymmetric memory portion. In some embodiments, there may be no unused asymmetric memory portion memory space between linearly assigned interleave units. In some embodiments, the memory control device assigning the interleave unit to the asymmetric memory portion in block 614 may be a CPU, a processor, a memory controller, an asymmetric rank interleave component, and/or an asymmetric channel interleave component.

In some embodiments, any number and combination of blocks 602-614 of the method 600 described with reference to FIG. 6 may be implemented for any number of consecutive interleave units (e.g., interleave units 402a-402c, 404a, 404b, 406a-406c, 408a, 408b in FIGS. 4A and 4C) in a memory space (e.g., memory space 400 in FIGS. 4A and 4C). The interleave units may correspond with addresses in the memory space. As such, interleave units may be assigned to an interleave granule (e.g., interleave granule 412a-412d, 414a-414d in FIGS. 4B and 4D) in an asymmetric memory portion memory space (e.g., DRAM portion memory space 410, 420 in FIGS. 4B and 4D). In some embodiments, consecutive interleave units from the memory space may be sequentially assigned to an interleave granule. In some embodiments, the consecutive interleave units may be assigned in the manner in which the addresses are mapped to the interleave granule. For example, the consecutive interleave units may be assigned in any order within the interleave granule. As another example, the interleave units may be assigned in a linear order within the interleave granule. In some embodiments, interleave units may be assigned to the interleave granule until the interleave granule is filled and before any interleave units are assigned to another interleave granule in the same asymmetric memory portion memory. In some embodiments, interleave units may be assigned to the interleave granule until the interleave granule is filled and before any interleave units are assigned to another interleave granule in the same asymmetric memory portion memory or another asymmetric memory portion memory.

Figure 7:
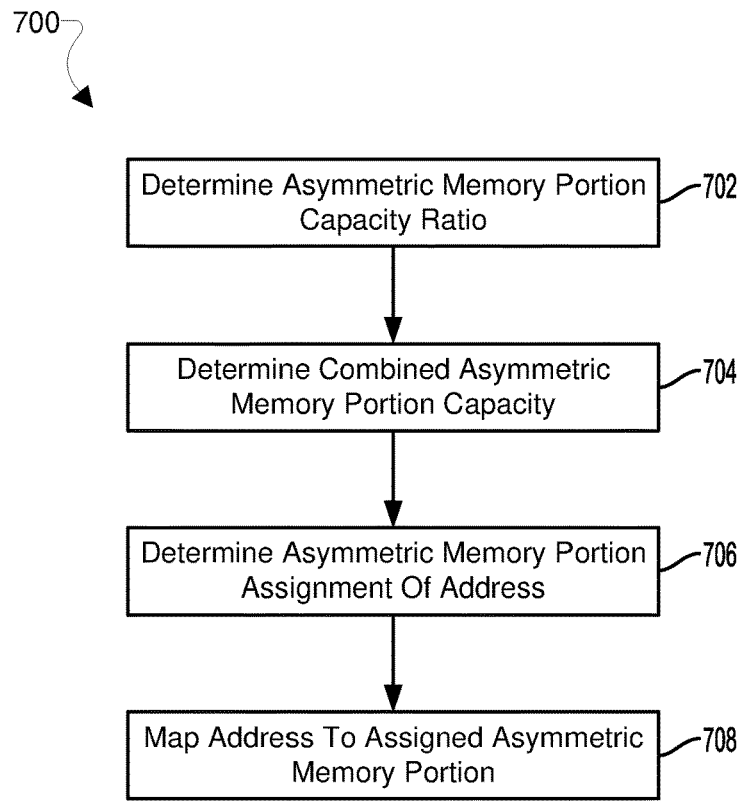
FIG. 7 is a process flow diagram illustrating a method for mapping addresses to asymmetric DRAM portions in a compact manner according to an embodiment.

FIG. 7 illustrates a method 700 for mapping addresses to asymmetric DRAM portions in a compact manner within asymmetric DRAM portions according to an embodiment. With reference to FIGS. 1-2C and 4A-7, the method 700 may be implemented in a computing device (e.g., computing device 100 in FIG. 1), in hardware (e.g., SoC 102, CPU 104, memory 106, 114, memory interface 110, processor 124, in FIG. 1, memory controller 202a, 202b, DRAM rank 204a, 204b, 204c, 204d, asymmetric rank interleave component 212a, 212b, asymmetric channel interleave component 216 in FIGS. 2A-2C), in software executing in a processor (e.g., memory controller 202a, 202b, asymmetric rank interleave component 212a, 212b, DRAM channel 214a, 214b, asymmetric channel interleave component 216 in FIGS. 2A-2C), or in a combination of a software-configured processor and dedicated hardware (e.g., memory controller 202a, 202b, asymmetric rank interleave component 212a, 212b, asymmetric channel interleave component 216 in FIGS. 2A-2C) that includes other individual components, and various memory/cache controllers (e.g., memory controller 202a, 202b in FIG. 2). In order to encompass the alternative configurations enabled in various embodiments, the hardware implementing the method 700 is referred to herein as a "memory control device."

In block 702 the memory control device may determine an asymmetric memory portion capacity ratio. In some embodiments, the capacity of multiple asymmetric memory portions (e.g., DRAM rank 204a, 204b, 204c, 204d, DRAM channel 214a, 214b in FIGS. 2A-2C) may be known to the memory control device, such as stored in an accessible memory. For example, the capacity of an asymmetric memory portion may be stored on a read-only memory, which may be an integral portion of the memory (e.g., memory 106, 114 in FIG. 1) having and/or included in the asymmetric memory portion. In some embodiments, the capacity of multiple asymmetric memory portions may be determined by the memory control device. The memory control device may compare the sizes of the asymmetric memory portions to determine the asymmetric memory portion capacity ratio. In some embodiments, the asymmetric memory portion capacity ratio may be known to the memory control device, such as stored in an accessible memory, and retrieved by the memory control device to determine the asymmetric memory portion capacity ratio. For example, the asymmetric memory portion capacity ratio may be previously determined, such as in block 602 of the method 600 described herein with reference to FIG. 6, as stored to a register or a buffer, which may be a portion of the memory. In some embodiments, the asymmetric memory portion capacity of a first asymmetric memory portion may be represented as "R0", the asymmetric memory portion capacity of a second asymmetric memory portion may be represented as "R1", and the asymmetric memory portion capacity ratio may equal R0:R1. In some embodiments, the memory control device determining the asymmetric memory portion capacity ratio in block 702 may be a CPU, a processor, a memory controller, an asymmetric rank interleave component, and/or an asymmetric channel interleave component.

In block 704, the memory control device may determine a combined asymmetric memory portion capacity. In some embodiments, the combined asymmetric memory portion capacity may be known to the memory control device, such as stored in an accessible memory, and retrieved by the memory control device to determine the combined asymmetric memory portion capacity. For example, the combined asymmetric memory portion capacity may be stored on a read-only memory, which may be an integral portion of the memory having and/or included in the asymmetric memory portions. In some embodiments, the combined asymmetric memory portion capacity may be determined by the memory control device. The memory control device may combine the sizes of the asymmetric memory portions to determine the combined asymmetric memory portion capacity ratio. In some embodiments, the combined asymmetric memory portion capacity ratio may be represented as "Rsum" where Rsum=R0+R1. In some embodiments, the combined asymmetric memory portion capacity may be known to the memory control device, such as stored in an accessible memory, and retrieved by the memory control device to determine the combined asymmetric memory portion capacity. For example, the combined asymmetric memory portion capacity may be previously determined, such as in block 606 of the method 600 described herein with reference to FIG. 6, as stored to a register or a buffer, which may be a portion of the memory. In some embodiments, the memory control device determining the combined asymmetric memory portion capacity in block 704 may be a CPU, a processor, a memory controller, an asymmetric rank interleave component, and/or an asymmetric channel interleave component.

In block 706, the memory control device may determine an asymmetric memory portion assignment of the address (e.g., an address of the memory access request received in block 502 of the method 500 described with reference to FIG. 5). In some embodiments, the memory control device determining the asymmetric memory portion assignment of the address in block 706 may be a CPU, a processor, a memory controller, an asymmetric rank interleave component, and/or an asymmetric channel interleave component. Addresses of a memory space (e.g., memory space 400 in FIGS. 4A and 4C) corresponding to a memory (e.g., memory 106, 114 in FIG. 1) may be mapped to individual asymmetric memory portion memory spaces (e.g., DRAM portion memory space 410, 420 in FIGS. 4B and 4D) corresponding to an individual asymmetric memory portion. In some embodiments, the addresses of the memory space may be divided among the asymmetric memory portions corresponding to a function of the combined asymmetric memory portion capacity and the asymmetric memory portion capacity ratio. For example, an amount of the addresses of the memory space assigned to an asymmetric memory portion memory space may be a function of the value of the asymmetric memory portion capacity ratio representing the capacity of the asymmetric memory portion. For example, the amount of the addresses of the memory space assigned to a first asymmetric memory portion memory space may equal R0/Rsum of the memory space and the amount of the addresses of the memory space assigned to a second asymmetric memory portion memory space may equal R1/Rsum of the memory space. In some embodiments, specific address assignments to the asymmetric memory portion may be determined as a function of the combined asymmetric memory portion capacity, the capacity of an asymmetric memory portion, and/or the asymmetric memory portion capacity ratio.

The address of a memory access request may be mapped to an asymmetric memory portion based on the mapping of the addresses of the memory space to the asymmetric memory portions. As a specific and nonlimiting example, a modulus of the address modulo the combined asymmetric memory portion capacity, Mod=Address % Rsum, may be compared to the asymmetric memory portion capacity ratio value of an asymmetric memory portion to determine to which asymmetric memory portion to assign the address. For example, a modulus that is smaller than the asymmetric memory portion capacity ratio value of an asymmetric memory portion may indicate to the memory control device that the address may be assigned to the asymmetric memory portion. For example, Mod<R0 may indicate to the memory control device that the address may be assigned to the first asymmetric memory portion. For two asymmetric memory portions, the modulus that is not smaller than the asymmetric memory portion capacity ratio value of an asymmetric memory portion may indicate to the memory control device that the address may be assigned to the other of the asymmetric memory portions. For example, Mod≥R0 may indicate to the memory control device that the address may be assigned to the second asymmetric memory portion. For more than two asymmetric memory portions, further modulus comparisons to asymmetric memory portion capacity ratio values of asymmetric memory portions may indicate to the memory control device that the address may be assigned to specific asymmetric memory portions.

In block 708, the memory control device may map the address to the assigned asymmetric memory portion. In some embodiments, the address may be mapped to the address space of the assigned asymmetric memory portion in a compact manner. For example, the address may be mapped to an address in the address space of the assigned asymmetric memory portion, as determined in block 706, such that the address is within a same interleave granule (e.g., interleave granule 412a-412d, 414a-414d in FIGS. 4B and 4D) of the assigned asymmetric memory portion as a previously mapped address. The interleave granule may be an amount of the asymmetric memory portion memory space, to which the address is assigned, of the interleave granule size for the asymmetric memory portion memory space, as determined in block 604 of the method 600 described with reference to FIG. 6. In some embodiments, there may be no unused address space between interleave granules in the address space of the assigned asymmetric memory portion. In some embodiments, addresses may be mapped to other interleave granules of the asymmetric memory portion once the interleave granule is filled. For another example, the address may be mapped to the address space of the assigned asymmetric memory portion in a non-linear manner. In other words, the address may be mapped to an address in the address space of the assigned asymmetric memory portion such that the address may be nonconsecutive with a previously mapped address in the address space of the assigned asymmetric memory portion. The address may be mapped in a non-linear manner within a same interleave granule as a previously mapped address. For another example, the address may be mapped to the address space of the assigned asymmetric memory portion in a linear manner. In other words, the address may be mapped to an address in the address space of the assigned asymmetric memory portion such that the address is consecutive with a previously mapped address such that no unused addresses are present between the mapped address and the previously mapped address in the address space of the assigned asymmetric memory portion. The address may be mapped in a linear manner within a same interleave granule as a previously mapped address. Mapping the address to the assigned asymmetric memory portion may be implemented as further described in the method 800 with reference to FIG. 8. In some embodiments, the memory control device mapping the address to the assigned asymmetric memory portion in block 708 may be a CPU, a processor, a memory controller, an asymmetric rank interleave component, and/or an asymmetric channel interleave component.

Figure 8:
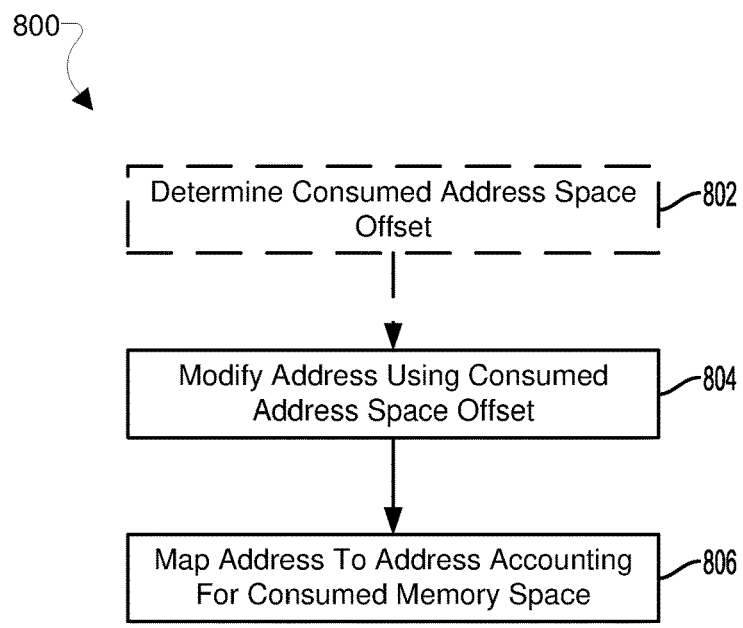
FIG. 8 is a process flow diagram illustrating a method for mapping addresses to assigned asymmetric DRAM portions according to an embodiment.

FIG. 8 illustrates a method 800 for mapping addresses to assigned asymmetric DRAM portions according to some embodiments. With reference to FIGS. 1-2C and 4A-8, the method 800 may be implemented in a computing device (e.g., computing device 100 in FIG. 1), in hardware (e.g., SoC 102, CPU 104, memory 106, 114, memory interface 110, processor 124, in FIG. 1, memory controller 202a, 202b, DRAM rank 204a, 204b, 204c, 204d, asymmetric rank interleave component 212a, 212b, asymmetric channel interleave component 216 in FIGS. 2A-2C), in software executing in a processor (e.g., memory controller 202a, 202b, asymmetric rank interleave component 212a, 212b, DRAM channel 214a, 214b, asymmetric channel interleave component 216 in FIGS. 2A-2C), or in a combination of a software-configured processor and dedicated hardware (e.g., memory controller 202a, 202b, asymmetric rank interleave component 212a, 212b, asymmetric channel interleave component 216 in FIGS. 2A-2C) that includes other individual components, and various memory/cache controllers (e.g., memory controller 202a, 202b in FIG. 2). In order to encompass the alternative configurations enabled in various embodiments, the hardware implementing the method 800 is referred to herein as an "memory control device."

In optional block 802, the memory control device may determine a consumed address space offset. In some embodiments, the memory control device determining the consumed address space offset in block 802 may be a CPU, a processor, a memory controller, an asymmetric rank interleave component, and/or an asymmetric channel interleave component. A memory access request may be addressed based on a memory space (e.g., memory space 400 in FIGS. 4A and 4C) corresponding to a memory (e.g., memory 106, 114 in FIG. 1). However, each asymmetric memory portion memory space (e.g., DRAM portion memory space 410, 420 in FIGS. 4B and 4D) corresponding to an individual asymmetric memory portion (e.g., DRAM rank 204a, 204b, 204c, 204d, DRAM channel 214a, 214b in FIGS. 2A-2C) may be differently addressed in comparison to the memory space. Further, with the memory space being divided among multiple asymmetric memory portion memory spaces, an amount of consumed memory space may not correspond to an amount of consumed asymmetric memory portion memory space. To map an address (e.g., address of the memory access request received in block 502 of the method 500 described herein with reference to FIG. 5) based on the addresses of the memory space to an asymmetric memory portion memory space in a compact manner, the noncorresponding consumed memory space may be accounted for. For example, the amount of consumed memory of the memory space that does not correspond with the consumed memory of the asymmetric memory portion memory space may be removed for determining the address in the asymmetric memory portion memory space to which to map the address of the memory space. In some embodiments, the amount of consumed memory of the memory space that does not correspond with the consumed memory of the asymmetric memory portion memory space may be an amount of consumed memory of a different asymmetric memory portion memory space. This amount of noncorresponding consumed memory may be the consumed address space offset.

As a specific and nonlimiting example, the address of the memory access request in the memory space may be divided by a combined asymmetric memory portion capacity, such as determined in block 704 of the method 700 described with reference to FIG. 7. The resulting quotient "Div" may be used in a function to determine the consumed address space offset. For example, Div=Address/Rsum. In some embodiments, the function may use a different variable based on the asymmetric memory portion to which the address is assigned, as determined in block 706 of the method 700 described with reference to FIG. 7. For example, the consumed address space offset for an address assigned to an asymmetric memory portion "Offset" may be the product of the quotient multiplied by a value of the asymmetric memory portion capacity ratio representing capacity of a different asymmetric memory portion, as determined in block 702 of the method 700 described with reference to FIG. 7, summed with a function of the modulus, as determined in block 706 of the method 700 described herein with reference to FIG. 7. For example, Offset=(Portion0)? (Div*R1+Mod>>1):(Div*R0+Mod>>1+1). In some embodiments, the Offset may be determined in various other manners that may represent consumed memory space.

In block 804, the memory control device may modify the address using the consumed address space offset "Offset." In some embodiments, the "Offset" may be a value determined in optional block 802. In some embodiments, the "Offset" may be a value determined in block 610 of the method 600 described herein with reference to FIG. 6. In some embodiments, the address may be modified to an address and/or a range of addresses within an interleave granule (e.g., interleave granule 412a-412d, 414a-414d in FIGS. 4B and 4D) in the asymmetric memory portion memory space to which the address is assigned in block 706 of the method 700 described herein with reference to FIG. 7. The interleave granule may be an amount of the asymmetric memory portion memory space, to which the address is assigned, of the interleave granule size for the asymmetric memory portion memory space, as determined in block 604 of the method 600 described with reference to FIG. 6. In some embodiments, the address may be modified to an address and/or a range of addresses within an interleave unit (e.g., interleave unit 402a-402c, 404a, 404b, 406a-406c, 408a, 408b in FIGS. 4A and 4C) mapped to the asymmetric memory portion memory space to which the address is assigned in block 706. The interleave unit may be mapped to the asymmetric memory portion memory space based on the amount of consumed memory space of the asymmetric memory portion, as determined in block 610. Multiple addresses may be mapped to the interleave unit in any order. For example, addresses may be mapped to the interleave unit in a non-linear manner. As another example, addresses may be mapped to the interleave unit in a linear manner. Addresses may continue to be mapped to interleave units of an interleave granule until the interleave granule is full. For example, a full interleave granule may have no unused asymmetric memory portion memory space between interleave units. In some embodiments, no address of a memory access request may be modified to be mapped to another interleave granule of any of the asymmetric memory portion memory spaces until the interleave granule is full. Modification of the addresses in such a manner may reduce a number of refresh segments used for a number of interleave units compared to existing rank or channel interleaving. Refresh schemes, like PASR or PAAR, may be enable refresh for the fewer refresh segments and disable refresh for more unused refresh segments. Refresh may be enabled for a refresh segment following full utilization of a refresh segment for which refresh was previously enabled.

In some embodiments the address may be modified to correspond to the amount of consumed memory space of the asymmetric memory portion to which it is assigned, as determined in optional block 802. In some embodiments, the address may be modified to be within a range of addresses of the interleave unit for the asymmetric memory portion memory space to which the address is assigned that is linearly successive or consecutive with the consumed memory space of the asymmetric memory portion. In some embodiments, such modification of the address may be non-linear within the range of addresses of the interleave unit. For example, the address may be modified to be non-linear with a previously mapped address in the interleave unit and/or between interleave units for the for the asymmetric memory portion memory space. As such, multiple interleave granules of the asymmetric memory portion memory space may be linear, without any unused memory space between the interleave granules of the asymmetric memory portion memory space, while each successive interleave granule of the asymmetric memory portion memory space may be filled in a non-linear manner.

In some embodiments, the address may be linearly successive or consecutive with the consumed memory space of the asymmetric memory portion to which it is assigned. As such, multiple mapped addresses of the asymmetric memory portion memory space may be linear, without any unused memory space between the mapped addresses of the asymmetric memory portion memory space. For example, the address may be modified to be linear with a previously mapped address. By extension, multiple interleave granules of the asymmetric memory portion memory space may be linear, without any unused memory space between the interleave granules of the asymmetric memory portion memory space, while each successive interleave granule of the asymmetric memory portion memory space may be filled in a linear manner. As a specific and nonlimiting example, the modified address "MapAddress" may be the difference between the address and the consumed address space offset. For example, MapAddress=Address−Offset. In some embodiments, the MapAddress may be determined in various other manners that may account for the consumed memory space. In some embodiments, the memory control device modifying the address using the consumed address space offset in block 804 may be a CPU, a processor, a memory controller, an asymmetric rank interleave component, and/or an asymmetric channel interleave component.

In block 806, the memory control device may map the address to an address in the assigned asymmetric memory portion accounting for the consumed memory space. The memory control device may map the address to a mapped address, which may be the modified address determined in block 804. In some embodiments, the mapping of the address to the map address may be stored in a data structure, such as a table, list, etc. in a memory (e.g., memory 106, 114 in FIG. 1) accessible to the memory control device. The mapping may further associate the address and the mapped address with the assigned asymmetric memory portion. In some embodiments, the address may correspond with an interleave unit (e.g., interleave unit 402a-402c, 404a, 404b, 406a-406c, 408a, 408b in FIGS. 4A and 4C) in the memory space, and the map address may correspond to the same interleave unit in the assigned asymmetric memory portion memory space. In some embodiments, the memory control device mapping the address to the address in the assigned asymmetric memory portion accounting for the consumed memory space in block 806 may be a CPU, a processor, a memory controller, an asymmetric rank interleave component, and/or an asymmetric channel interleave component.

In some embodiments, any number and combination of blocks 702-708 of the method 700 described herein with reference to FIG. 7 and blocks 802-806 of the method 800 described herein with reference to FIG. 8 may be implemented for any number of consecutive addresses in a memory space (e.g., memory space 400 in FIGS. 4A and 4C). The addresses may correspond with addresses in the memory space. As such, addresses may be mapped to an interleave granule (e.g., interleave granule 412a-412d, 414a-414d in FIGS. 4B and 4D) and/or an interleave unit (e.g., interleave units 402a-402c, 404a, 404b, 406a-406c, 408a, 408b in FIGS. 4A and 4C) in an asymmetric memory portion memory space (e.g., DRAM portion memory space 410, 420 in FIGS. 4B and 4D). In some embodiments, consecutive addresses from the memory space may be sequentially mapped to an interleave granule and/or an interleave unit. For example, the consecutive addresses may be mapped in any order within the interleave granule and/or the interleave unit. As another example, the addresses may be mapped in a linear order within the interleave granule and/or the interleave unit. In some embodiments, addresses may be assigned to the interleave granule until the interleave granule is filled and before any addresses are assigned to another interleave granule in the same asymmetric memory portion memory. In some embodiments, addresses may be assigned to the interleave granule until the interleave granule is filled and before any addresses are assigned to another interleave granule in the same asymmetric memory portion memory or another asymmetric memory portion memory.

Figure 9:
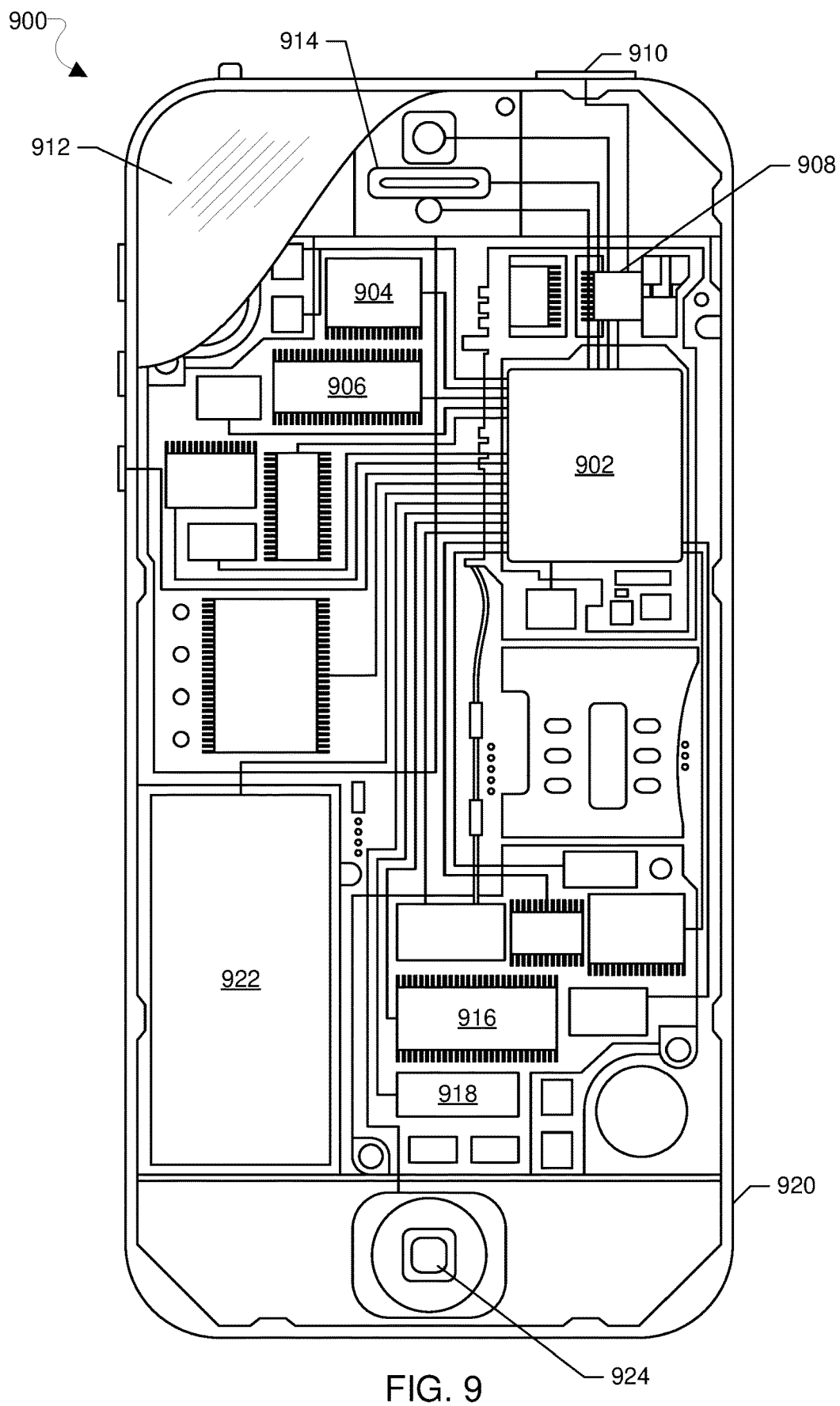
FIG. 9 is a component block diagram illustrating an example mobile computing device suitable for implementing the various embodiments.

A system in accordance with the various embodiments (including, but not limited to, embodiments described above with reference to FIGS. 1-8) may be implemented in a wide variety of computing systems including mobile computing devices, an example of which suitable for use with the various embodiments is illustrated in FIG. 9. The mobile computing device 900 may include a processor 902 coupled to a touchscreen controller 904 and an internal memory 906. The processor 902 may be one or more multicore integrated circuits designated for general or specific processing tasks. The internal memory 906 may be volatile or non-volatile memory, and may also be secure and/or encrypted memory, or unsecure and/or unencrypted memory, or any combination thereof. Examples of memory types that can be leveraged include but are not limited to DDR, LPDDR, GDDR, WIDEIO, RAM, SRAM, DRAM, P-RAM, R-RAM, M-RAM, STT-RAM, and embedded DRAM. The touchscreen controller 904 and the processor 902 may also be coupled to a touchscreen panel 912, such as a resistive-sensing touchscreen, capacitive-sensing touchscreen, infrared sensing touchscreen, etc. Additionally, the display of the mobile computing device 900 need not have touch screen capability.

The mobile computing device 900 may have one or more radio signal transceivers 908 (e.g., Peanut, Bluetooth, Zig-Bee, Wi-Fi, RF radio) and antennae 910, for sending and receiving communications, coupled to each other and/or to the processor 902. The transceivers 908 and antennae 910 may be used with the above-mentioned circuitry to implement the various wireless transmission protocol stacks and interfaces. The mobile computing device 900 may include a cellular network wireless modem chip 916 that enables communication via a cellular network and is coupled to the processor.

The mobile computing device 900 may include a peripheral device connection interface 918 coupled to the processor 902. The peripheral device connection interface 918 may be singularly configured to accept one type of connection, or may be configured to accept various types of physical and communication connections, common or proprietary, such as Universal Serial Bus (USB), FireWire, Thunderbolt, or PCIe. The peripheral device connection interface 918 may also be coupled to a similarly configured peripheral device connection port (not shown).

The mobile computing device 900 may also include speakers 914 for providing audio outputs. The mobile computing device 900 may also include a housing 920, constructed of a plastic, metal, or a combination of materials, for containing all or some of the components described herein. The mobile computing device 900 may include a power source 922 coupled to the processor 902, such as a disposable or rechargeable battery. The rechargeable battery may also be coupled to the peripheral device connection port to receive a charging current from a source external to the mobile computing device 900. The mobile computing device 900 may also include a physical button 924 for receiving user inputs. The mobile computing device 900 may also include a power button 924 for turning the mobile computing device 900 on and off.

Figure 10:
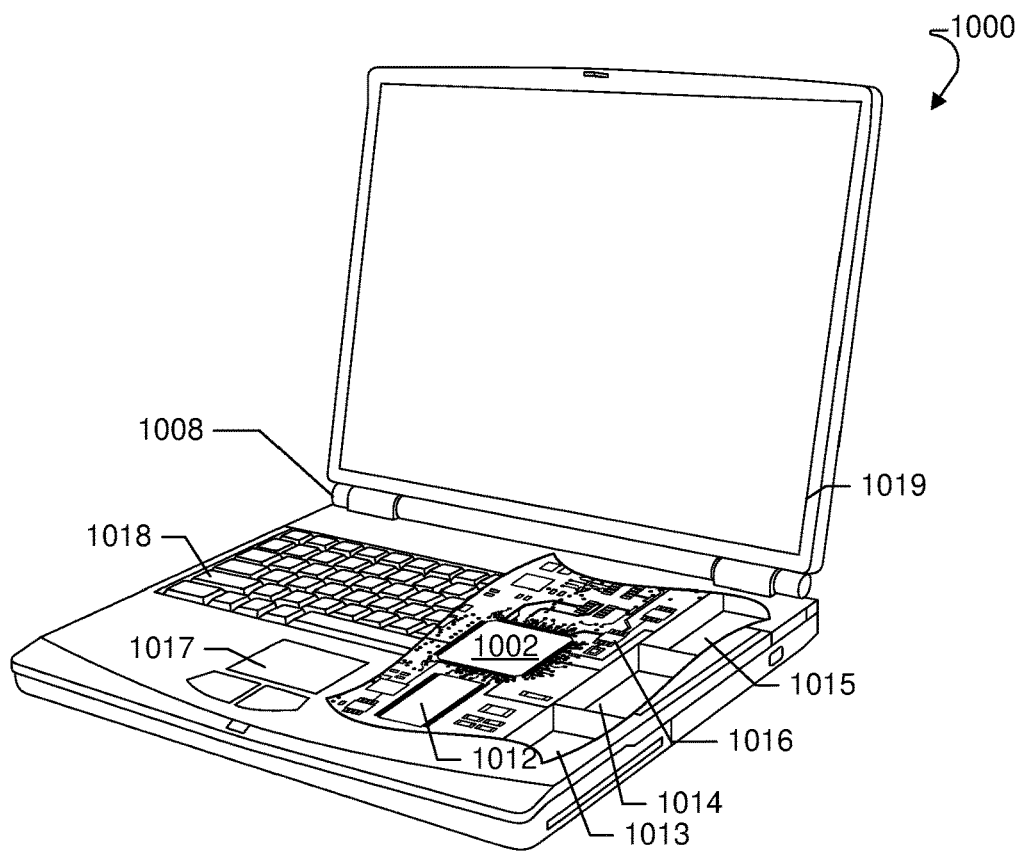
FIG. 10 is a component block diagram illustrating an example mobile computing device suitable for implementing the various embodiments.
Figure 11:
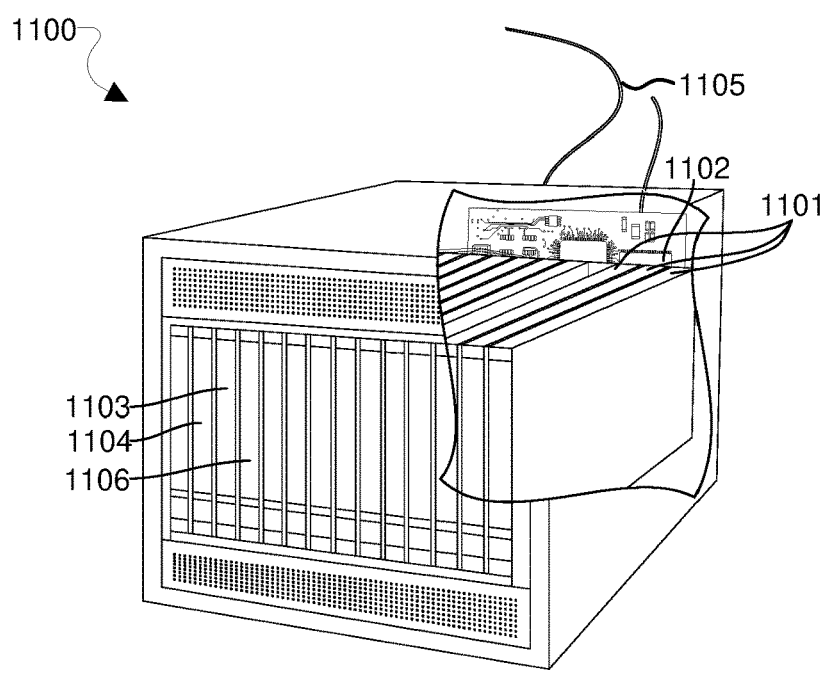
FIG. 11 is a component block diagram illustrating an example server suitable for implementing the various embodiments.

A system in accordance with the various embodiments (including, but not limited to, embodiments described above with reference to FIGS. 1-8) may be implemented in a wide variety of computing systems include a laptop computer 1000 an example of which is illustrated in FIG. 10. Many laptop computers include a touchpad touch surface 1017 that serves as the computer's pointing device, and thus may receive drag, scroll, and flick gestures similar to those implemented on computing devices equipped with a touch screen display and described above. A laptop computer 1000 will typically include a processor 1002 coupled to volatile memory 1012 and a large capacity nonvolatile memory, such as a disk drive 1013 of Flash memory. Additionally, the computer 1000 may have one or more antenna 1008 for sending and receiving electromagnetic radiation that may be connected to a wireless data link and/or cellular telephone transceiver 1016 coupled to the processor 1002. The computer 1000 may also include a floppy disc drive 1014 and a compact disc (CD) drive 1015 coupled to the processor 1002. In a notebook configuration, the computer housing includes the touchpad 1017, the keyboard 1018, and the display 1019 all coupled to the processor 1002. Other configurations of the computing device may include a computer mouse or trackball coupled to the processor (e.g., via a USB input) as are well known, which may also be used in conjunction with the various embodiments.

A system in accordance with the various embodiments (including, but not limited to, embodiments described above with reference to FIGS. 1-8) may also be implemented in fixed computing systems, such as any of a variety of commercially available servers. An example server 1100 is illustrated in FIG. 12. Such a server 1100 typically includes one or more multicore processor assemblies 1101 coupled to volatile memory 1102 and a large capacity nonvolatile memory, such as a disk drive 1104. As illustrated in FIG. 12, multicore processor assemblies 1101 may be added to the server 1100 by inserting them into the racks of the assembly. The server 1100 may also include a floppy disc drive, compact disc (CD) or digital versatile disc (DVD) disc drive 1106 coupled to the processor 1101. The server 1100 may also include network access ports 1103 coupled to the multicore processor assemblies 1101 for establishing network interface connections with a network 1105, such as a local area network coupled to other broadcast system computers and servers, the Internet, the public switched telephone network, and/or a cellular data network (e.g., CDMA, TDMA, GSM, PCS, 3G, 4G, LTE, 5G or any other type of cellular data network).

Implementation examples are described in the following paragraphs. While some of the following implementation examples are described in terms of example methods, further example implementations may include: the example methods discussed in the following paragraphs implemented by a computing device including a processing device configured with processor-executable instructions to perform operations of the example methods; the example methods discussed in the following paragraphs implemented by a computing device including means for performing functions of the example methods; and the example methods discussed in the following paragraphs implemented as a non-transitory processor-readable storage medium having stored thereon processor-executable instructions configured to cause a processor of a computing device to perform the operations of the example methods.

Example 1. A method of portion interleaving for asymmetric size memory portions of a memory, including determining an asymmetric memory portion assignment for a first interleave unit, in which the asymmetric memory portion assignment is to a first asymmetric memory portion, determining a consumed address space offset for consumed address space of the memory, modifying an address of the first interleave unit using the consumed address space offset, and assigning the first interleave unit to a first interleave granule in the first asymmetric memory portion using the modified address in a compact manner such that the first interleave unit is assigned to the first interleave granule while the first interleave granule has unused space before mapping another interleave unit to another interleave granule.

Example 2. The method of example 1, in which determining the consumed address space offset for consumed address space of the memory includes determining the consumed address space offset for consumed address space of at least a second asymmetric memory portion.

Example 3. The method of example 2, in which modifying the address of the first interleave unit using the consumed address space offset includes subtracting the consumed address space offset from the address of the first interleave unit.

Example 4. The method of claim any of examples 1-3, in which determining the asymmetric memory portion assignment for the first interleave unit includes determining an asymmetric memory portion capacity ratio of asymmetric size memory portions including the first asymmetric memory portion, determining a combined asymmetric memory portion capacity of the asymmetric size memory portions, determining a value of a function using the address of the first interleave unit and the combined asymmetric memory portion capacity, and comparing the value of the function to a value of the asymmetric memory portion capacity ratio of asymmetric size memory portions representing an asymmetric size memory portion of the asymmetric size memory portions.

Example 5. The method of any of examples 1-4, further including receiving an address of a memory access request in the memory, mapping the address to the first interleave unit in the first asymmetric memory portion, and implementing the memory access request at the mapped address within the first asymmetric memory portion.

Example 6. The method of any of examples 1-5, in which assigning the first interleave unit to the first interleave granule in the first asymmetric memory portion using the modified address in the compact manner includes assigning the first interleave unit to the first interleave granule in the first asymmetric memory portion linearly to a second interleave unit assigned to the first interleave granule in the first asymmetric memory portion.

Example 7. The method of any of examples 1-5, in which assigning the first interleave unit to the first interleave granule in the first asymmetric memory portion using the modified address in the compact manner includes assigning the first interleave unit to the first interleave granule in the first asymmetric memory portion nonlinearly to a second interleave unit assigned to the first interleave granule in the first asymmetric memory portion.

Example 8. The method of any of examples 1-7, in which assigning the first interleave unit to the first interleave granule in the first asymmetric memory portion using the modified address in the compact manner such that the first interleave unit is assigned to the first interleave granule while the first interleave granule has unused space before mapping another interleave unit to another interleave granule includes assigning the first interleave unit to the first interleave granule in the first asymmetric memory portion such that the first interleave unit is assigned to the first interleave granule while the first interleave granule has unused space before mapping another interleave unit to another interleave granule in another asymmetric memory portion.

Example 9. The method of any of examples 1-8, further including enabling refresh of a first refresh segment having the assigned first interleave unit, and disabling refresh of a second refresh segment not having an assigned interleave unit.

Example 10. The method of any of examples 1-9, in which the first interleave granule is a same size as a refresh segment for a dynamic random-access memory refresh control policy.

Example 11. A method of portion interleaving for asymmetric size memory portions of a memory, including receiving an address of a memory access request in the memory, mapping the address to a first interleave granule in a first asymmetric memory portion, assigning consecutive interleave units to the first interleave granule while the first interleave granule has unused space before assigning another interleave unit to another interleave granule, in which at least a first interleave unit of the consecutive interleave units corresponds to the address, and implementing the memory access request at the mapped address within the first asymmetric memory portion.

Example 12. The method of example 11, in which mapping the address to the first interleave granule in the first asymmetric memory portion includes determining a consumed address space offset for consumed address space of the memory in a second asymmetric memory portion, and modifying the address using the consumed address space offset.

Example 13. The method of example 12, in which modifying the address using the consumed address space offset includes subtracting the consumed address space offset from the address.

Example 14. The method of any of examples 11-13, in which mapping the address to the first interleave granule includes determining an asymmetric memory portion assignment of the address.

Example 15. The method of example 14, in which determining the asymmetric memory portion assignment of the address includes determining an asymmetric memory portion capacity ratio of asymmetric size memory portions including the first asymmetric memory portion, determining a combined asymmetric memory portion capacity of the asymmetric size memory portions, determining a value of a function using the address and the combined asymmetric memory portion capacity, and comparing the value of the function to a value of the asymmetric memory portion capacity ratio of asymmetric size memory portions representing an asymmetric size memory portion of the asymmetric size memory portions.

Example 16. The method of any of examples 11-15, in which assigning consecutive interleave units to the first interleave granule includes assigning a first consecutive interleave unit of the consecutive interleave units linearly to a second interleave unit of the consecutive interleave units.

Example 17. The method of any of examples 11-15, in which assigning consecutive interleave units to the first interleave granule includes assigning a first consecutive interleave unit of the consecutive interleave units nonlinearly to a second interleave unit of the consecutive interleave units.

Example 18. The method of any of examples 11-17, in which assigning consecutive interleave units to the first interleave granule includes assigning the consecutive interleave units to a refresh segment for a dynamic random-access memory refresh control policy while the first refresh segment has unused space before assigning another interleave unit to another refresh segment.

Computer program code or "program code" for execution on a programmable processor for carrying out operations of the various embodiments may be written in a high level programming language such as C, C++, C#, Smalltalk, Java, JavaScript, Visual Basic, a Structured Query Language (e.g., Transact-SQL), Perl, or in various other programming languages. Program code or programs stored on a computer readable storage medium as used in this application may refer to machine language code (such as object code) whose format is understandable by a processor.

The foregoing method descriptions and the process flow diagrams are provided merely as illustrative examples and are not intended to require or imply that the operations of the various embodiments must be performed in the order presented. As will be appreciated by one of skill in the art the order of operations in the foregoing embodiments may be performed in any order. Words such as "thereafter," "then," "next," etc. are not intended to limit the order of the operations; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm operations described in connection with the various embodiments may be implemented as electronic hardware, computer software, or combinations of both. To clearly illustrate this interchangeability of hardware and software, various illustrative components, blocks, modules, circuits, and operations have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

The hardware used to implement the various illustrative logics, logical blocks, modules, and circuits described in connection with the embodiments disclosed herein may be implemented or performed with a general purpose processor, a digital signal processor (DSP), an application-specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some operations or methods may be performed by circuitry that is specific to a given function.

In one or more embodiments, the functions described may be implemented in hardware, software, firmware, or any combination thereof. If implemented in software, the functions may be stored as one or more instructions or code on a non-transitory computer-readable medium or a non-transitory processor-readable medium. The operations of a method or algorithm disclosed herein may be embodied in a processor-executable software module that may reside on a non-transitory computer-readable or processor-readable storage medium. Non-transitory computer-readable or processor-readable storage media may be any storage media that may be accessed by a computer or a processor. By way of example but not limitation, such non-transitory computer-readable or processor-readable media may include RAM, ROM, EEPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above are also included within the scope of non-transitory computer-readable and processor-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the claims. Various modifications to these embodiments will be readily apparent to those skilled in the art, and the generic principles defined herein may be applied to other embodiments and implementations without departing from the scope of the claims. Thus, the present disclosure is not intended to be limited to the embodiments and implementations described herein, but is to be accorded the widest scope consistent with the following claims and the principles and novel features disclosed herein.

What is claimed is:

1. A method of portion interleaving for asymmetric size memory portions of a memory, comprising:
   receiving an address of a memory access request in the memory;
   mapping the address to a first interleave granule in a first asymmetric memory portion, wherein mapping the address to the first interleave granule in the first asymmetric memory portion comprises:
      determining a consumed address space offset for consumed address space of the memory in a second asymmetric memory portion; and
      modifying the address using the consumed address space offset;
   assigning consecutive interleave units to the first interleave granule while the first interleave granule has unused space before assigning another interleave unit to another interleave granule, wherein at least a first interleave unit of the consecutive interleave units corresponds to the address; and
   implementing the memory access request at the mapped address within the first asymmetric memory portion.

2. The method of claim 1, wherein modifying the address using the consumed address space offset comprises subtracting the consumed address space offset from the address.

3. The method of claim 1, wherein mapping the address to the first interleave granule comprises determining an asymmetric memory portion assignment of the address.

4. The method of claim 3, wherein determining the asymmetric memory portion assignment of the address comprises:
   determining an asymmetric memory portion capacity ratio of asymmetric size memory portions including the first asymmetric memory portion;
   determining a combined asymmetric memory portion capacity of the asymmetric size memory portions;
   determining a value of a function using the address and the combined asymmetric memory portion capacity; and
   comparing the value of the function to a value of the asymmetric memory portion capacity ratio of asymmetric size memory portions representing an asymmetric size memory portion of the asymmetric size memory portions.

5. The method of claim 1, wherein assigning consecutive interleave units to the first interleave granule comprises assigning a first consecutive interleave unit of the consecutive interleave units linearly to a second interleave unit of the consecutive interleave units.

6. The method of claim 1, wherein assigning consecutive interleave units to the first interleave granule comprises assigning a first consecutive interleave unit of the consecutive interleave units nonlinearly to a second interleave unit of the consecutive interleave units.

7. The method of claim 1, wherein assigning consecutive interleave units to the first interleave granule comprises assigning the consecutive interleave units to a first refresh segment for a dynamic random-access memory refresh control policy while the first refresh segment has unused space before assigning another interleave unit to another refresh segment.

8. A computing device, comprising a processing device configured to perform operations comprising:
   receiving an address of a memory access request in a memory;
   mapping the address to a first interleave granule in a first asymmetric memory portion, wherein mapping the address to the first interleave granule in the first asymmetric memory portion comprises:
      determining a consumed address space offset for consumed address space of the memory in a second asymmetric memory portion; and
      modifying the address using the consumed address space offset;
   assigning consecutive interleave units to the first interleave granule while the first interleave granule has unused space before assigning another interleave unit to another interleave granule, wherein at least a first interleave unit of the consecutive interleave units corresponds to the address; and
   implementing the memory access request at the mapped address within the first asymmetric memory portion.

9. The computing device of claim 8, wherein the processing device is configured to perform operations such that modifying the address using the consumed address space offset comprises subtracting the consumed address space offset from the address.

10. The computing device of claim 8, wherein the processing device is configured to perform operations such that mapping the address to the first interleave granule comprises determining an asymmetric memory portion assignment of the address.

11. The computing device of claim 10, wherein the processing device is configured to perform operations such that determining the asymmetric memory portion assignment of the address comprises:
   determining an asymmetric memory portion capacity ratio of asymmetric size memory portions including the first asymmetric memory portion;
   determining a combined asymmetric memory portion capacity of the asymmetric size memory portions;
   determining a value of a function using the address and the combined asymmetric memory portion capacity; and
   comparing the value of the function to a value of the asymmetric memory portion capacity ratio of asymmetric size memory portions representing an asymmetric size memory portion of the asymmetric size memory portions.

12. The computing device of claim 8, wherein the processing device is configured to perform operations such that assigning consecutive interleave units to the first interleave granule comprises assigning a first consecutive interleave unit of the consecutive interleave units linearly to a second interleave unit of the consecutive interleave units.

13. The computing device of claim 8, wherein the processing device is configured to perform operations such that assigning consecutive interleave units to the first interleave granule comprises assigning a first consecutive interleave unit of the consecutive interleave units nonlinearly to a second interleave unit of the consecutive interleave units.

14. The computing device of claim 8, wherein the processing device is configured to perform operations such that assigning consecutive interleave units to the first interleave granule comprises assigning the consecutive interleave units to a first refresh segment for a dynamic random-access memory refresh control policy while the first refresh segment has unused space before assigning another interleave unit to another refresh segment.

15. A computing device, comprising:
means for receiving an address of a memory access request in a memory;
means for mapping the address to a first interleave granule in a first asymmetric memory portion, wherein means for mapping the address to the first interleave granule in the first asymmetric memory portion comprises:
means for determining a consumed address space offset for consumed address space of the memory in a second asymmetric memory portion; and
means for modifying the address using the consumed address space offset;
means for assigning consecutive interleave units to the first interleave granule while the first interleave granule has unused space before assigning another interleave unit to another interleave granule, wherein at least a first interleave unit of the consecutive interleave units corresponds to the address; and
means for implementing the memory access request at the mapped address within the first asymmetric memory portion.

16. The computing device of claim 15, wherein means for modifying the address using the consumed address space offset comprises means for subtracting the consumed address space offset from the address.

17. The computing device of claim 15, wherein means for mapping the address to the first interleave granule comprises means for determining an asymmetric memory portion assignment of the address.

18. The computing device of claim 17, wherein means for determining the asymmetric memory portion assignment of the address comprises:
means for determining an asymmetric memory portion capacity ratio of asymmetric size memory portions including the first asymmetric memory portion;
means for determining a combined asymmetric memory portion capacity of the asymmetric size memory portions;
means for determining a value of a function using the address and the combined asymmetric memory portion capacity; and
means for comparing the value of the function to a value of the asymmetric memory portion capacity ratio of asymmetric size memory portions representing an asymmetric size memory portion of the asymmetric size memory portions.

19. The computing device of claim 15, wherein means for assigning consecutive interleave units to the first interleave granule comprises means for assigning a first consecutive interleave unit of the consecutive interleave units linearly to a second interleave unit of the consecutive interleave units.

20. The computing device of claim 15, wherein means for assigning consecutive interleave units to the first interleave granule comprises means for assigning a first consecutive interleave unit of the consecutive interleave units nonlinearly to a second interleave unit of the consecutive interleave units.

21. The computing device of claim 15, wherein means for assigning consecutive interleave units to the first interleave granule comprises means for assigning the consecutive interleave units to a first refresh segment for a dynamic random-access memory refresh control policy while the first refresh segment has unused space before assigning another interleave unit to another refresh segment.

22. A non-transitory processor-readable medium having stored thereon processor-executable instructions configured to cause a processing device to perform operations comprising:
receiving an address of a memory access request in a memory;
mapping the address to a first interleave granule in a first asymmetric memory portion, wherein the stored processor-executable instructions are configured to cause the processing device to perform operations such that mapping the address to the first interleave granule in the first asymmetric memory portion comprises:
determining a consumed address space offset for consumed address space of the memory in a second asymmetric memory portion; and
modifying the address using the consumed address space offset;
assigning consecutive interleave units to the first interleave granule while the first interleave granule has unused space before assigning another interleave unit to another interleave granule, wherein at least a first interleave unit of the consecutive interleave units corresponds to the address; and
implementing the memory access request at the mapped address within the first asymmetric memory portion.

23. The non-transitory processor-readable medium of claim 22, wherein the stored processor-executable instructions are configured to cause the processing device to perform operations such that modifying the address using the consumed address space offset comprises subtracting the consumed address space offset from the address.

24. The non-transitory processor-readable medium of claim 22, wherein the stored processor-executable instructions are configured to cause the processing device to perform operations such that mapping the address to the first interleave granule comprises determining an asymmetric memory portion assignment of the address.

25. The non-transitory processor-readable medium of claim 24, wherein the stored processor-executable instructions are configured to cause the processing device to perform operations such that determining the asymmetric memory portion assignment of the address comprises:
determining an asymmetric memory portion capacity ratio of asymmetric size memory portions including the first asymmetric memory portion;

determining a combined asymmetric memory portion capacity of the asymmetric size memory portions;

determining a value of a function using the address and the combined asymmetric memory portion capacity; and comparing the value of the function to a value of the asymmetric memory portion capacity ratio of asymmetric size memory portions representing an asymmetric size memory portion of the asymmetric size memory portions.

26. The non-transitory processor-readable medium of claim 22, wherein the stored processor-executable instructions are configured to cause the processing device to perform operations such that assigning consecutive interleave units to the first interleave granule comprises assigning a first consecutive interleave unit of the consecutive interleave units linearly to a second interleave unit of the consecutive interleave units.

27. The non-transitory processor-readable medium of claim 22, wherein the stored processor-executable instructions are configured to cause the processing device to perform operations such that assigning consecutive interleave units to the first interleave granule comprises assigning a first consecutive interleave unit of the consecutive interleave units nonlinearly to a second interleave unit of the consecutive interleave units.

28. The non-transitory processor-readable medium of claim 22, wherein the stored processor-executable instructions are configured to cause the processing device to perform operations such that assigning consecutive interleave units to the first interleave granule comprises assigning the consecutive interleave units to a first refresh segment for a dynamic random-access memory refresh control policy while the first refresh segment has unused space before assigning another interleave unit to another refresh segment.

* * * * *